United States Patent [19]
Taniguchi et al.

[11] Patent Number: 5,798,838
[45] Date of Patent: *Aug. 25, 1998

[54] PROJECTION EXPOSURE APPARATUS HAVING FUNCTION OF DETECTING INTENSITY DISTRIBUTION OF SPATIAL IMAGE, AND METHOD OF DETECTING THE SAME

[75] Inventors: Tetsuo Taniguchi, Yokohama; Toshihiko Tsuji, Inba-gun; Tadashi Nagayama, Tokyo, all of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 713,719

[22] Filed: Sep. 13, 1996

[30] Foreign Application Priority Data

Feb. 28, 1996 [JP] Japan ................................. 8-067220
Feb. 28, 1996 [JP] Japan ................................. 8-067224

[51] Int. Cl.$^6$ .......................... H01L 21/30; G01B 11/00
[52] U.S. Cl. ............... 356/401; 355/53; 355/55; 355/67; 355/72; 364/490; 364/491
[58] Field of Search .................... 355/53, 55, 67, 355/68, 72; 356/401; 364/490, 491

[56] References Cited

U.S. PATENT DOCUMENTS

| | | | |
|---|---|---|---|
| 4,780,617 | 10/1988 | Umatate et al. | 250/548 |
| 4,871,237 | 10/1989 | Anzai et al. | 350/419 |
| 5,189,494 | 2/1993 | Muraki | 356/401 |
| 5,483,349 | 1/1996 | Suzuki | 356/401 |
| 5,621,497 | 4/1997 | Terasawa et al. | 355/53 |
| 5,661,548 | 8/1997 | Imai | 355/55 |

FOREIGN PATENT DOCUMENTS

| | | |
|---|---|---|
| 60-18738 | 1/1985 | Japan . |
| 60-28613 | 2/1985 | Japan . |
| 60-79357 | 5/1985 | Japan . |
| 63-81818 | 4/1988 | Japan . |
| 59-94032 | 5/1994 | Japan . |

*Primary Examiner*—Daniel P. Malley
*Attorney, Agent, or Firm*—Foley & Lardner

[57] ABSTRACT

The invention relates to a projection exposure apparatus for detecting a light-intensity distribution of a spatial image of a mask pattern formed through a projection optical system. The projection exposure apparatus has a knife-edge member which is disposed on the main surface of a wafer stage such that a plane including an exposure surface of a photosensitive substrate is leveled with a light incidence surface of the knife-edge member. The knife-edge member has a transmission area for transmitting the exposure light passing through the projection optical system, a light shielding area for preventing transmission of the exposure light, and a knife-edge defined as a boundary line between the transmission area and the light shielding area. The projection exposure apparatus detects the light-intensity distribution of light from the spatial image while moving the spatial image of the mask pattern and the knife-edge of the knife-edge member relatively to each other. The information related to the light-intensity distribution is used in optically adjusting a projection optical system, or the like.

26 Claims, 17 Drawing Sheets

TO MAIN CONTROL SYSTEM 400

TO MAIN CONTROL SYSTEM 400

PROJECTION EXPOSURE APPARATUS HAVING FUNCTION OF DETECTING INTENSITY DISTRIBUTION OF SPATIAL IMAGE, AND METHOD OF DETECTING THE SAME

BACKGROUND OF THE INVENTION

1. Field of the Invention

The present invention relates to a projection exposure apparatus used in fabricating a semiconductor device, liquid crystal display elements, or the like, through lithography processes and, more particularly, to a technique of detecting the intensity distribution of a spatial image of the mask pattern formed through the projection optical system and utilizing the thus-obtained information for controlling the optical characteristics of the projection optical system, or the like.

2. Related Background Art

Projection optical systems, which are mounted, for example, in a projection exposure apparatus for fabricating semiconductor integrated circuits or liquid crystal devices, require extremely high accuracy with respect to projection or optical performance, including image formation characteristics such as projection magnification and image distortion. The projection or optical performance is included in the optical characteristics of the entire exposure apparatus. For this reason, a method for measuring such optical performance of the projection optical system with high accuracy and a correction method for correcting the various characteristics with high accuracy have been developed. At present, there are roughly two methods for measuring the various optical performances of the projection optical system.

The first method is one which transfers a pattern of a test mask to a photosensitive substrate (e.g., a photoresist-coated wafer). This method is disclosed, for example, in Japanese Patent Laid-Open Publication No. Sho 58-8353. In the first method, the test mask pattern is transferred onto a photosensitive substrate, and after the photosensitive substrate has been moved a predetermined distance in accordance with a laser interferometer, the pattern is again transferred onto the substrate, so that it overlaps with the previously transferred pattern. After development of the substrate, the overlap error or registration error is measured. At this time, since marks overlap, one above the other, after the photosensitive substrate has been moved, the marks are patterns drawn at different places on the test mask.

The second method is one wherein an image of a pattern formed on a photosensitive substrate is measured directly by a photoelectric sensor without carrying out actual exposure processes as in the first method. This second method is disclosed, for example, in Japanese Patent Laid-Open Publication Nos. Sho 59-94032 or Sho 60-18738.

SUMMARY OF THE INVENTION

The present invention relates to a projection exposure apparatus having a projection optical system, which requires highly accurate projection or optical performance, for fabricating semiconductor integrated circuits or liquid crystal devices, and also relates to an inspection apparatus for carrying out an inspection method and a projection exposure system provided with the inspection apparatus. The invention is applicable to a stepper type projection exposure apparatus but is particularly suitable for use with the projection exposure apparatus of a scan exposure type, such as a slit-scan type or step-and-scan type, wherein patterns of geometric shapes formed on a mask are serially transferred on a photosensitive substrate while scanning a mask and a substrate in a synchronous manner.

One object of the present invention is to obtain a projection exposure apparatus that is capable of detecting the light-intensity distribution of a spatial image of the mask pattern formed through a projection optical system corresponding to modifications arbitrarily made to the specifications of the projection optical system, as required. The projection exposure apparatus is provided with a knife-edge member having a light incidence surface leveled with the plane that includes the surface of a wafer laid on the main surface of a wafer stage, and a structure for supporting the knife-edge member such that it is maintained in the above-described level. The knife-edge member is provided with a transmission area which permits exposure light to pass through, a light-shielding area which does not allow the exposure light to pass through, and a knife-edge defined as a boundary line between the transmission area and the light-shielding area. The projection exposure apparatus receives light from a spatial image of the mask pattern while moving the spatial image and the knife-edge of the knife-edge member relatively to each other, and detecting the light-intensity distribution of the spatial image formed on the light incidence surface of the knife-edge member. The information related to the light-intensity distribution is utilized as information for use in optically adjusting the projection optical system, or the like.

The projection exposure apparatus of the present invention comprises at least the following components as the basic components of a common exposure apparatus, as shown in, e.g., FIGS. 1 and 2. Specifically, the projection exposure apparatus comprises at least an illumination optical system 1 for illuminating a mask on which a predetermined pattern (mask pattern) is formed with exposure light having a predetermined wavelength, a wafer stage (including at least an X-Y stage 4 and a stage 40) allowing a photosensitive substrate 42 to be held on the main surface thereof, a projection optical system 3 for projecting an image of the mask pattern onto an exposure surface of the photosensitive substrate, a transmission area 57 (e.g., FIG. 3) for transmitting the exposure light passing through the projection optical system, a light-shielding area 56 for preventing the exposure light, a knife-edge member 5 (see FIGS. 4–6) having a knife-edge 58 defined as a boundary line between the transmission area 57 and the light-shielding area 56, a light receiving device 41 (photosensor) for receiving light from a spatial image (a primary spatial image) of the mask pattern, a drive mechanism for changing a relative position between the spatial image of the mask pattern formed on the light incidence surface 50 of the knife-edge member 5 through the projection optical system 3 and the knife-edge 58 of the knife-edge member 5, and a detection mechanism to detect the light-intensity distribution of the spatial image of the mask pattern on the basis of a relative position between the spatial image of the mask pattern and the knife-edge 58 of the knife-edge member 5 and an output from the photosensor 41 that receives light passing through the knife-edge member 5. The drive mechanism includes at least an interferometer 45 for specifying the position of the wafer stage, a drive motor 43, a stage control system 200, and a main control system 400. The detection mechanism includes at least the main control system 400 and the photosensor 41. The photosensitive substrate 42 described herein is made up of a substrate 420, such as silicon wafers or glass plates, and a photosensitive material film 421, such as a photoresist, applied to the surface of the substrate 420 (see FIG. 2).

In particular, in the projection exposure apparatus of the present invention, the knife-edge member 5 is disposed such that the light incidence surface 50 is level with the reference plane P that substantially includes the exposure surface of the photosensitive substrate 42 when the photosensitive substrate 42 is placed on a main surface 4a of the X-Y stage 4 via a wafer holder 46. With this arrangement, the drive mechanism changes a relative position between the spatial image of the mask pattern and the knife-edge 58 of the knife-edge member 5 while leveling the light incidence surface 50 of the knife-edge member 5 with the reference plane P.

A support structure 500 for supporting the knife-edge member 5 is provided on the main surface 4a of the X-Y stage 4, as shown in, e.g., FIGS. 4 and 5. This support structure 500 has a supporting surface 501 to substantially level the light incidence surface 50 of the knife-edge member 5 with the reference plane P.

The photosensor 41 should preferably be housed in the space formed within the X-Y stage 4. The knife-edge member 5 is positioned in an opening portion of the space.

In the projection exposure apparatus of the present invention, the knife-edge 58 defined as a boundary line between the transmission area 57 and the light-shielding area 56 is aligned by, e.g., the support structure 500 provided on the main surface 4a of the X-Y stage 4. The photosensor 41 for receiving light from the spatial image of the mask pattern formed on the knife-edge member 5 through the projection optical system 3 is housed in, e.g., the space formed within the X-Y stage 4. With this arrangement, when the X-Y stage 4 is moved relatively to the projection optical system such that the knife-edge 58 scans the spatial image of the mask pattern, the light-intensity distribution of the spatial image of the mask pattern can be detected on the basis of an output produced by the photosensor 41 as a result of the scanning operation.

Because of this, it is possible to detect the light-intensity distribution of the spatial image of the mask pattern formed on the light incidence surface 50 of the knife-edge member 5 through the projection optical system 3, as required, without the necessity of processes such as a patterning process, a development process, observation of a resist image using an electron microscope, or the like. The optical performance of the projection optical system 3 can be controlled, as required, on the basis of the thus-detected information related to the light-intensity distribution of the spatial image without carrying out practical exposure operations.

In another preferred mode of the projection exposure apparatus of the present invention, at least a condenser optical system 8 may be disposed in the space formed in the X-Y stage 4, and the photosensor 41 may be disposed outside the X-Y stage 4, as shown in, e.g., FIG. 19. The condenser optical system 8 converges light from the spatial image (i.e., the primary spatial image) formed on the light incidence surface 50 of the knife-edge member 5 through the projection optical system 3 and, then, forms a secondary spatial image of the mask pattern. In this case, the projection exposure apparatus should preferably be provided with a waveguide (e.g., a light guide 10) for introducing light from the secondary spatial image of the mask pattern to the outside of the X-Y stage 4. The light guide 10 is arranged such that a first end face 10a is positioned so as to correspond to an image surface on which the secondary spatial image of the mask pattern is formed, and that a second end face 10b is positioned so as to correspond to a light receiving surface of the photosensor 41 disposed outside the X-Y stage 4.

Further in the projection exposure apparatus of the present invention, a condenser optical system 80 and an optical diffuser 81 (an optically diffusing element) should preferably be provided between the knife-edge member 5 and the photosensor 41 in order to prevent inconsistencies in sensitivity, as shown in, e.g., FIG. 20. The condenser optical system 80 converges light from the primary spatial image of the mask pattern formed on the light incidence surface 50 of the knife-edge member 5 through the projection optical system 3 and, then, forms a secondary spatial image of the mask pattern. The optically diffusing element 81 is disposed in the optical path of the condenser optical system 80 so as to diffuse light from the primary spatial image of the mask pattern. With this configuration, at least the condenser optical system 80 and the optically diffusing element 81 are disposed in predetermined locations within the storage capacity of the X-Y stage 4. The photosensor 41 may be disposed either in the storage capacity of the X-Y stage 4 or outside the X-Y stage 4. When the photosensor 41 is disposed outside the X-Y stage 4, it should preferably be further provided with, e.g., the light guide 10, as shown in FIG. 26.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

With reference to the accompanying drawings, the preferred embodiments of the present invention will be described.

Figure 1:
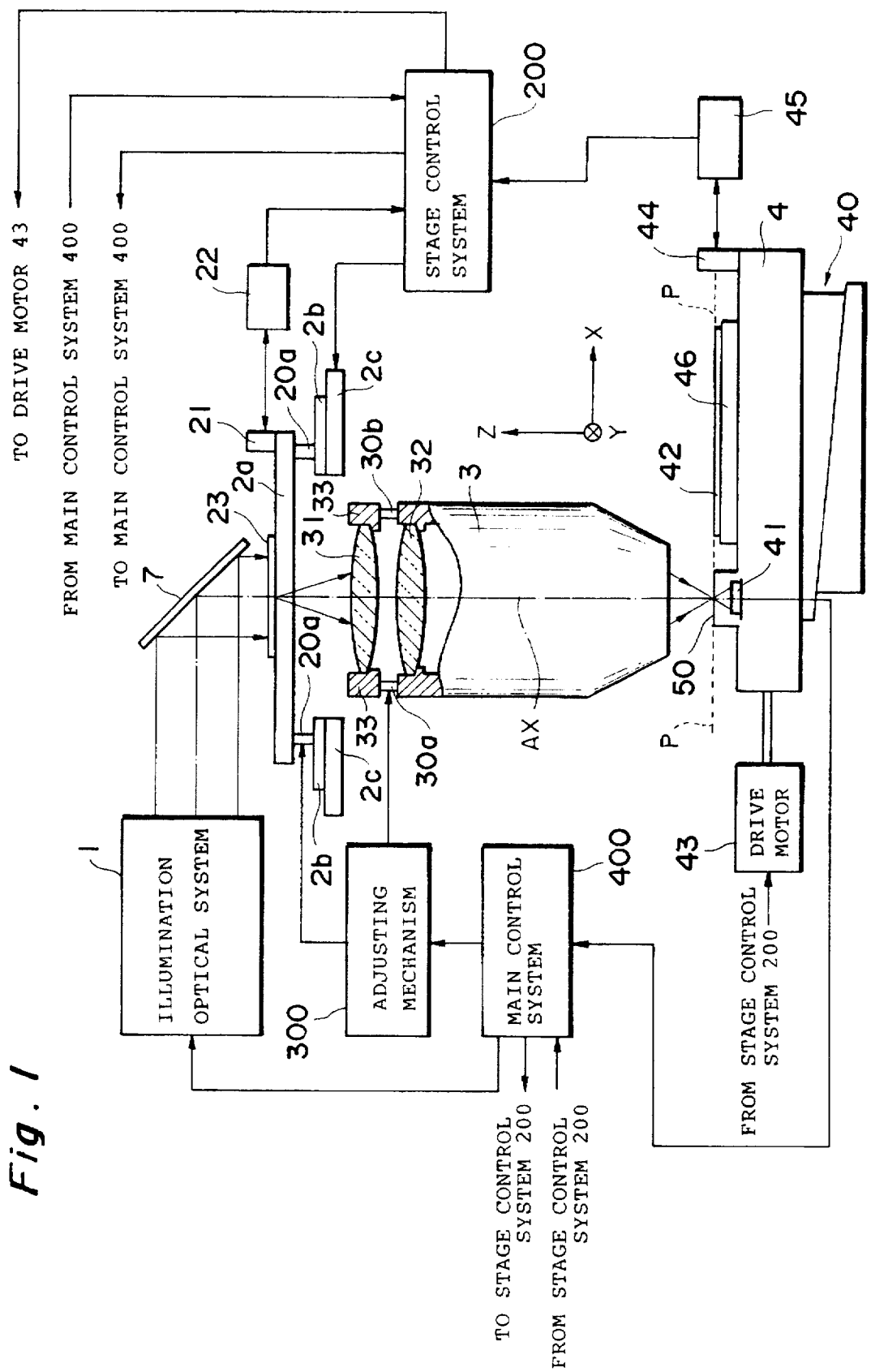
FIG. 1 is a schematic diagram showing the overall configuration of a projection exposure apparatus according to the present invention.
Figure 2:
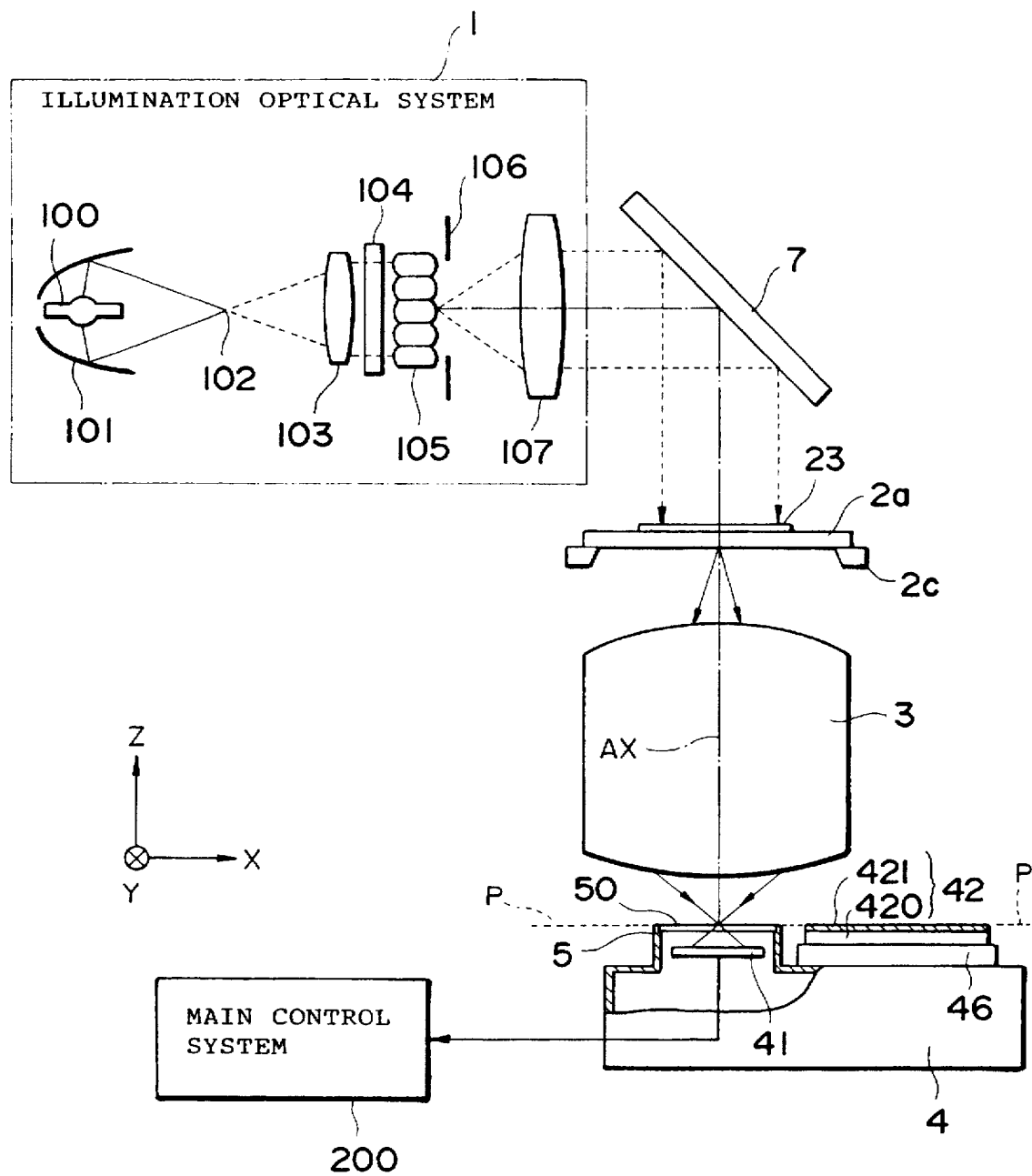
FIG. 2 is a diagrammatic representation showing the configuration of a first embodiment of a projection exposure apparatus according to the present invention.

FIGS. 1 and 2 are schematic diagrams showing the configuration of a projection exposure apparatus according to one embodiment of the present invention.

In particular, FIG. 2 shows only the principle components of the projection exposure apparatus shown in FIG. 1.

In FIGS. 1 and 2, the Z-axis is defined to be in parallel to the optical axis AX of a projection optical system 3; the X-axis is defined to be in parallel to the sheets of FIGS. 1 and 2 and within the plane perpendicular to the optical axis AX of the projection optical axis 3; and the Y-axis is defined as being in a direction perpendicular to the sheets of FIGS. 1 and 2 within the plane perpendicular to the optical axis AX of the projection optical system 3. All the coordinates shown in the other drawings FIGS. 3 through 26 match the above-described coordinates.

The projection optical apparatus shown in FIGS. 1 and 2 is provided with a light source 100 consisting of, e.g., a mercury-vapor lamp. This light source 100 is positioned in a first focal point of a parabolic reflecting mirror 101 that has a parabolic reflecting surface. The illumination luminous flux emitted from the light source 100 forms a light source image (i.e., a primary light source) at a second focal point 102 of the parabolic reflecting mirror 101.

The luminous flux originated from the light source image is converted into a substantially collimated luminous flux by an input lens 103. The thus-converted luminous flux then enters a band-pass filer 104 that allows only a luminous flux having a desired wavelength to pass through. Illumination light having the exposure wavelength selected by the band-pass filer 104 (e.g., "i" rays at a wavelength of 365 nm or "g" rays at a wavelength of 436 nm) enters a fly-eye integrator 105. The luminous flux that enter the fly-eye integrator 105 is split by a plurality of lens elements constituting the fly-eye integrator 105, so that a second light source consisting of a plurality of light source images is formed. The illuminance of the illumination light is made uniform through the input lens 103 and the fly-eye integrator 105.

The luminous flux originated from the second light source is limited by an aperture stop 106, and then the thus-limited luminous flux illuminates a mask 23, on which a predetermined mask pattern is formed, in a superimposed manner through a condenser lens 107 and a reflecting mirror 7. The mask 23 is supported on a mask stage 2a such that its main surface is included within the X-Y plane. The X-Y coordinates of the mask stage 2a, or the X-Y coordinates of the mask 23, are constantly measured by a laser interferometer 22 for use with the mask stage 2a.

The luminous flux that passes through the pattern of the mask 23 reaches an exposure surface of a photosensitive substrate 42 (which includes a substrate 420 and a photoresist 421 and will be hereinafter referred to as a wafer) via a projection optical system 3. As a result, a pattern image of the mask 23 is formed on the wafer 42.

The wafer 40 is supported on a wafer stage via a wafer holder 46 that has its main surface within the X-Y plane. The wafer stage comprises an X-Y stage 4, which two-dimensionally positions the wafer 42 within the X-Y plane, a Z stage 40, which positions the wafer 42 in the Z direction, and a leveling stage for correcting an angle of inclination of the wafer 42. The X-Y coordinates of the X-Y stage 4, or the X-Y coordinates of the wafer 42, are constantly measured by a laser interferometer 45 for use with the wafer stage. The mask pattern of the mask 23 can be transferred onto each of multiple exposure areas of the wafer 42 one after another by exposing the wafer 42 to the luminous flux while being two-dimensionally actuated and controlled.

More specifically, the illumination light is converted into a luminous flux having a substantially uniform illuminance distribution through the optical elements disposed in the illumination optical system 1 in the manner as previously described, as shown in FIG. 2. In addition to the bright-light of the extra-high pressure mercury-vapor lamp, a KrF excimer laser beam, an ArF excimer laser beam, a copper vapor laser beam, or harmonics of a YAG laser beam can be used as the illumination light.

In the illumination optical system 1, optimum illumination conditions are selected by changing the numerical aperture (i.e., σ-value which is a coherence factor of the illumination optical system 1) of an aperture stop 106 of an illumination system including the optical elements 103 to 107, or by adjusting the elements according to various conditions such as a pattern of an object to be exposed (e.g., a linewidth, a pitch, a periodical pattern, or an isolated pattern) using ring-shaped illumination, or the like.

The illumination light emitted from the illumination optical system is reflected vertically in a downward direction by the reflecting mirror 7, so that the pattern (e.g., a pattern of an integrated circuit) formed on the mask 23 is illuminated and projected onto the wafer 42 through the projection optical system 3.

The mask 23 is held on the mask stage 2a by vacuum suction. The mask stage 2a slightly moves in a two-dimensional plane (i.e., the X-Y plane) perpendicular to the optical axis AX of the projection optical system 3, so that the mask 23 is aligned at a desired position. The mask stage 2a is attached to slide members 2b through at least two drive elements such as piezoelectric elements capable of expanding and contracting in the Z direction (only two drive elements 20a and 20b of all the drive elements are shown in FIG. 1). The slide members 2b are mounted on a mask base 2c of a main body (frame) of the projection exposure apparatus in a slidable manner so that they can freely slide in the X direction. Since the projection optical system 3 is also fixed to the main body, the gap between the projection optical system 3 and the mask 23 can be varied by the drive elements 20a and 20b. These drive elements 20a and 20b are controlled by an adjusting system 300.

The mask stage 2a (i.e., the slide member 2b) is moved on the mask base 2c at a specified scan speed in the ± X directions (i.e., in the direction of scanning) by a stage control system 200 that includes a linear motor. By means of the reciprocation of the mask stage 2a, the overall surface of the mask 23 can cross at least the optical axis AX of the projection optical system 3. A movable mirror 21 for reflecting the laser beam emitted from the external laser interferometer 22 is mounted on the edge of the mask stage 2a. Therefore, the laser interferometer 22 can constantly detect the position of the mask stage 2a in the direction of scanning with a resolution of, e.g., of the order of 0.01 μm. The value measured by the laser interferometer 22 is sent to a stage control system 200. The stage control system 200 controls the drive motor for use with the mask stage 2a on the basis of the thus-received information. That information is further fed to the main control system 400 from the stage control system 200. Then, the main control system 400 controls the stage control system 200 on the basis of the information.

Next, the diagrammatic configuration of some of the previously described exposure apparatus (i.e., the wafer stage mechanism) will be described with reference to FIG. 3.

In general, the wafer stage mechanism of the exposure apparatus comprises the Z stage 40 for vertically moving the wafer 42 along the optical axis AX of the projection optical system 3, the X-Y stage 4 that is movable in the X-Y direction as shown in the drawing and is placed on the Z stage 40, and a rotatable stage (functions as the wafer holder 46) disposed on the X-Y stage 4. An image of the predetermined pattern formed on the mask 23 (e.g., reticle) is formed on the wafer 42 placed on the wafer holder 46 by means of the projection optical system 3. A motor 43B moves the X-Y stage 4 to a predetermined location in the Y direction according to a control signal received from the stage control system 200. A motor 43A moves the X-Y stage to a predetermined location in the X direction according to the control signal received from the stage control system 200. A motor 47 rotates the wafer holder 46 through only a predetermined angle according to the control signal received from the stage control system 200.

A movable mirror 44A is mounted on the X-Y stage 4 (an object) in parallel to the X direction in the drawing. As a result, the movable mirror 44A can be moved together with the X-Y stage 4. The principle elements of the interferometer 45A for detecting displacements of the movable mirror 44A in the X direction are disposed so as to be opposite to the movable mirror 44A while being housed in a predetermined case. Similarly, a movable mirror 44B is also mounted on the X-Y stage 4 (the object) in parallel to the Y direction in the drawing and can be moved together with the X-Y stage 4. The principle elements of an interferometer 45B for detecting displacements of the movable mirror 44B in the Y direction are disposed so as to be opposite to the movable mirror 44B while being housed in a predetermined case. The movable mirror 21 and the interferometer 22 for detecting displacements of the mask stage 2a are also made up of an element for detecting displacements of the mask stage 2a in the X direction and an element for detecting displacements of the mask stage 2a in the Y direction.

With the previously described configuration, the interferometer 45A (included in the interferometer 45 shown in FIG. 1) measures a displacement D1 of the X-Y stage 4 in the Y direction (i.e., displacements of the movable mirror 44A), whereas the interferometer 45B (included in the interferometer 45 shown in FIG. 1) measures a displacement D2 of the X-Y stage 4 in the X direction. For example, provided that the position of the X-Y stage before its movement is defined as the reference position, the current position of the X-Y stage (i.e., the current position of the X-Y stage 4 that is an object of exposure) can be precisely specified on the basis of the reference position and the displacement measured by the interferometer 45. Therefore, the main control system 400 can drive and control the X-Y stage 4 with high precision relative to a spatial image of the pattern formed on the mask 23.

The detailed structure of the previously described wafer stage is disclosed in, for example, U.S. Pat. No. 4,780,617. Similarly, the drive and position detection systems for use with the mask stage 2a are provided for the X direction and the Y direction, respectively.

A support structure 500 for supporting a knife-edge member 5 in a predetermined position is formed in a main surface 4a of the X-Y stage 4 having the wafer holder 46 loaded thereon. The support structure 500 has a space for housing a light receiving sensor 41.

Figure 4:
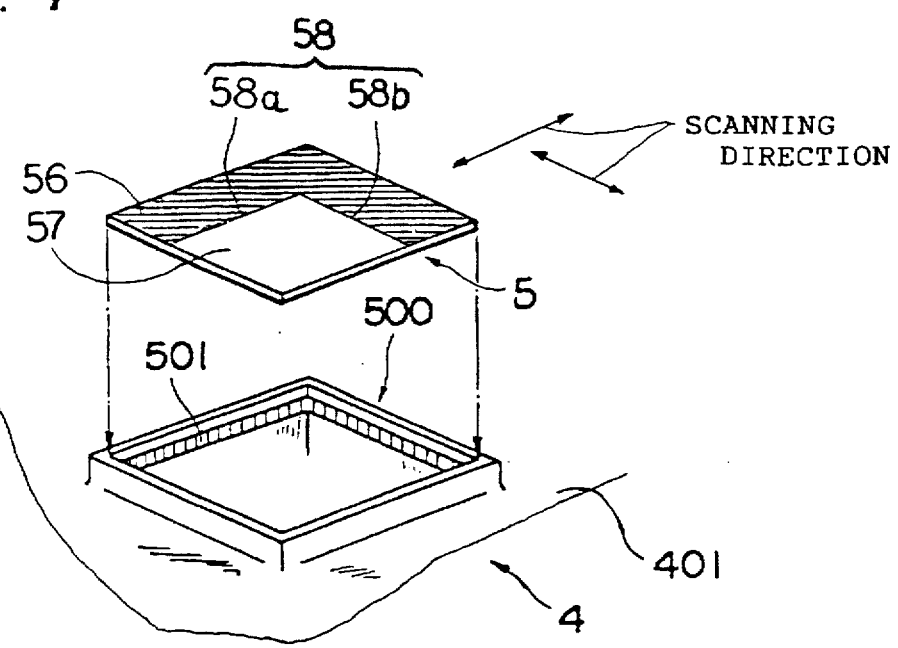
FIG. 4 is a diagrammatic representation of a first structure for mounting a knife-edge member on the X-Y stage.
Figure 5:
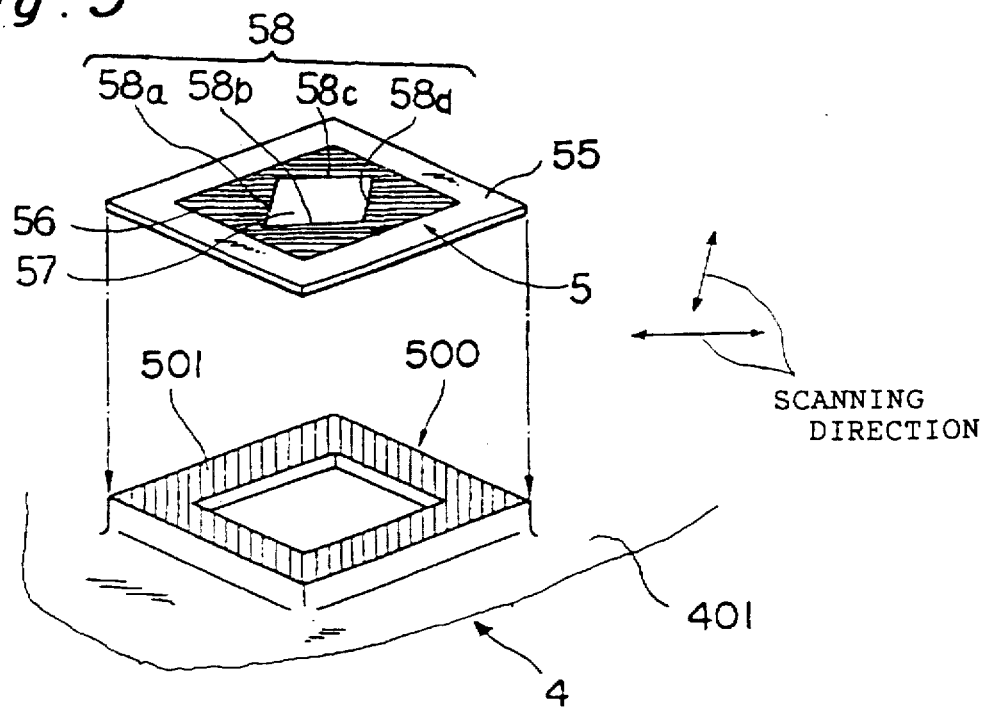
FIG. 5 is a diagrammatic representation of a second structure for mounting the knife-edge member on the X-Y stage.

The support structure 500 further has a reference surface 501 (a supporting surface) for leveling a light incidence surface 50 (FIGS. 1, 2) of the knife-edge member 5 with the exposure surface of the wafer while it supports the knife-edge member 5, as shown in FIGS. 4 and 5. FIG. 4 shows a structure for housing the knife-edge member 5 in a predetermined position within the stage, and FIG. 5 shows a structure for fixing the knife-edge member 5 in a predetermined position outside the stage. A metal frame 55 may be attached to the periphery of the knife-edge member 5 in order to provide easy handling.

The knife-edge member 5 consisting of, e.g., a glass substrate, is positioned in the vicinity of the wafer holder 46 on the X-Y stage 4 by the support structure 500. The support structure 500 substantially levels (in the Z direction) the upper surface of the knife-edge member 5 (i.e., the light incidence surface 50) with an exposure surface of the wafer 42. The support structure 500 is formed in the main surface 4a of the X-Y stage 4 and has an opening. The knife-edge member 5 is fixedly placed in a predetermined position by means of a reference surface 501 defined along the opening. FIGS. 4 and 5 show various embodiments of the support structure 500 having the reference surface 501.

Figure 6:
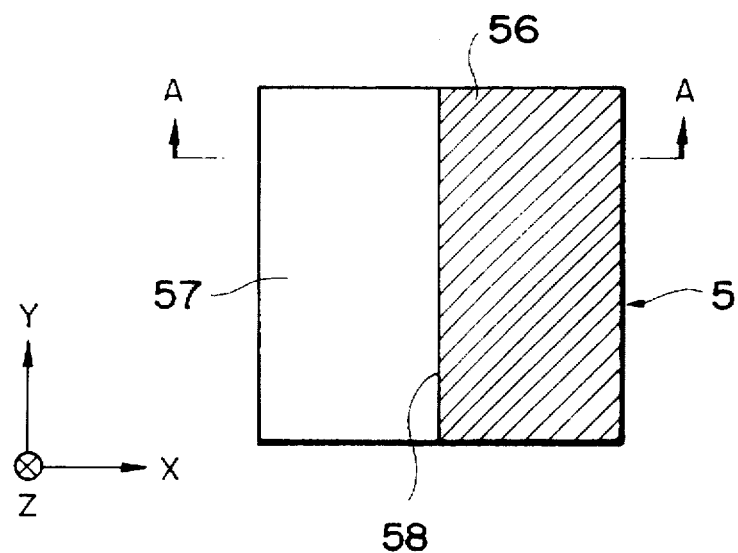
FIG. 6 is a plan view showing the structure of the knife-edge member.
Figure 7:
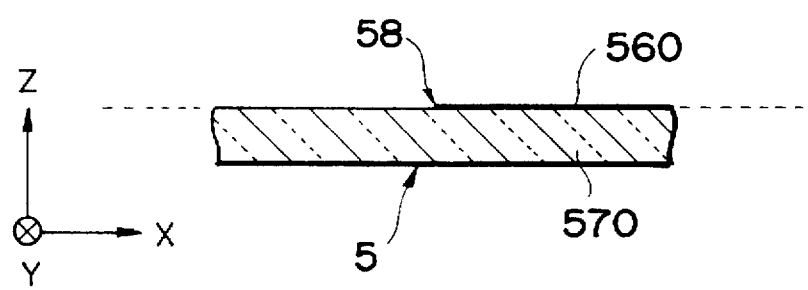
FIG. 7 is a cross-sectional view showing the cross section of the knife-edge member along the line A—A in FIG. 6.

The knife-edge member 5 is made up of a transmission area 57, that allows the exposure light to pass through, and a light-shielding area 56, that does not allow the exposure light to pass through, as shown in FIG. 6. A knife-edge 58 which extends along the Y direction is defined as a boundary line between the transmission area 57 and the light-shielding area 56. The light-shielding area 56 is made by depositing an evaporation film 560, such as a chrome evaporation film possessing light-shielding properties, onto the surface of a glass plate 570, as shown in FIG. 7. The light-shielding area 56 of the knife-edge member 5 according to the present invention may be patterned with various shapes. For example, as shown in FIG. 3, inner edges of the light-shielding area 56 define a parallelogram-shaped area as the transmission area 57, and the knife-edge member 5 has at least two knife-edges 58a and 58b. In this case, since a scanning direction of the knife-edge member 5 corresponds to the X-direction, the knife-edge member 5 of FIG. 3 is preferably moved along the X-direction by the X-Y stage 4. Further, as shown in FIG. 4, the light-shielding area 56 may be patterned in an L-shape. In this case, the knife-edge member 5 of FIG. 4 has at least two knife-edges 58a and 58b. Since the knife-edges 58a and 58b correspond to the X-direction and the Y-direction of FIG. 3 when the knife-edge member 5 of FIG. 5 is set at the support structure 500, the knife-edge member 5 of FIG. 4 set at the support structure 500 is preferably moved along the X-direction or the Y-direction. Still further, as shown in FIG. 5, inner edges of the light-shielding area 56 may define a square-shaped area as the transmission area 57. In this case, the knife-edge member 5 has at least four knife edges 58a, 58b, 58c and 58d. Since the knife-edges 58a, 58b, 58c and 58d are tilted at 45° with respect to the X-direction and the Y-direction of FIG. 3 when the knife-edge member 5 of FIG. 5 is set at the support structure 500, the knife-edge member 5 of FIG. 5 set at the support structure 500 is preferably moved along a direction tilted at 45° with respect to the X-direction and the Y-direction.

The photosensor 41 (a photo-sensitive device) is disposed in the space that is defined below the knife-edge member 5, as shown in the drawings (see FIGS. 2 and 3). The photosensor 41 should preferably have as small sensitivity inconsistencies as possible with regard to the position and angle of acceptance of light, as well as having a light receiving surface that is large enough to receive the luminous flux. An electric signal output from the photosensor 41 is fed to the main control system 400.

Figure 8:
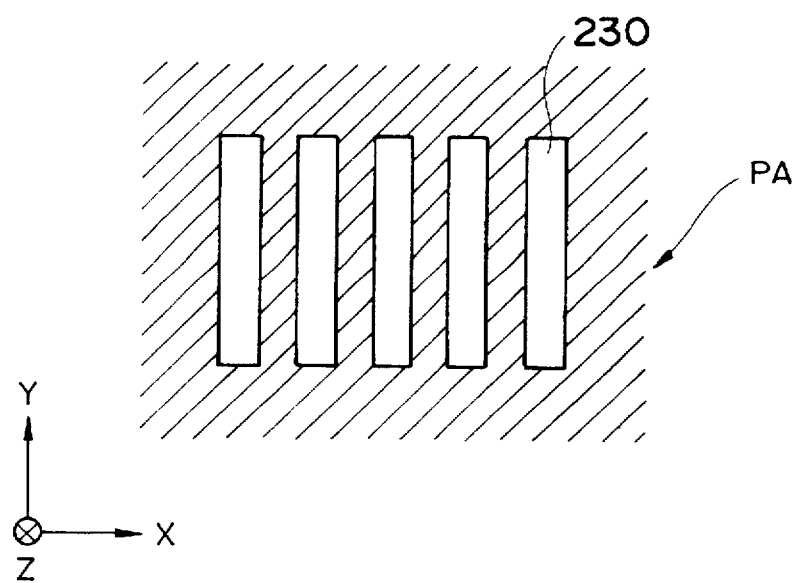
FIG. 8 is a diagrammatic representation of a mask pattern formed on a mask.

FIG. 8 diagrammatically shows the pattern that is formed on the mask 23 and is shown in FIG. 2, or the like. In a first embodiment, rectangular light transmission areas 230 that extend in the Y direction are arrayed in a pattern area PA of the mask 23 on a predetermined pitch in the X direction, as shown in FIG. 8. In short, the mask pattern shown in FIG. 8 is a Line and Space pattern including line-patterns arranged along the X direction. The Line and Space pattern is hereinafter referred to as L&S pattern.

Figure 9:
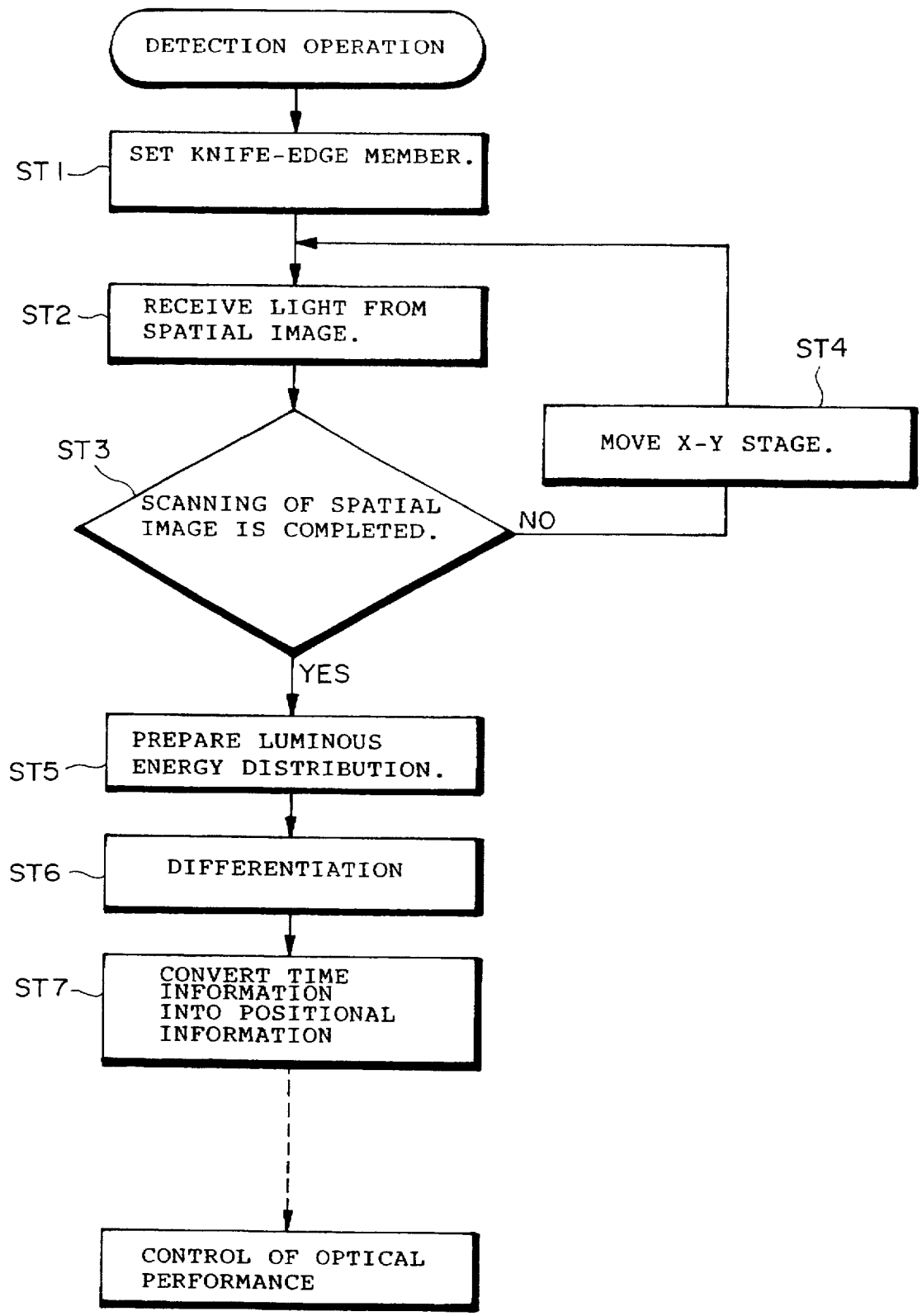
FIG. 9 is a flowchart for explaining the operations for detecting the light-intensity distribution of a primary spatial image of the mask pattern formed on a light incidence surface of the knife-edge member.

With reference to a flowchart shown in FIG. 9, the detection of the light-intensity distribution of a spatial image of the mask pattern formed through the projection optical system 3 in the first embodiment will now be described. In this embodiment, the knife-edge member 5 is previously set in a predetermined location on the X-Y stage.

Figure 10:
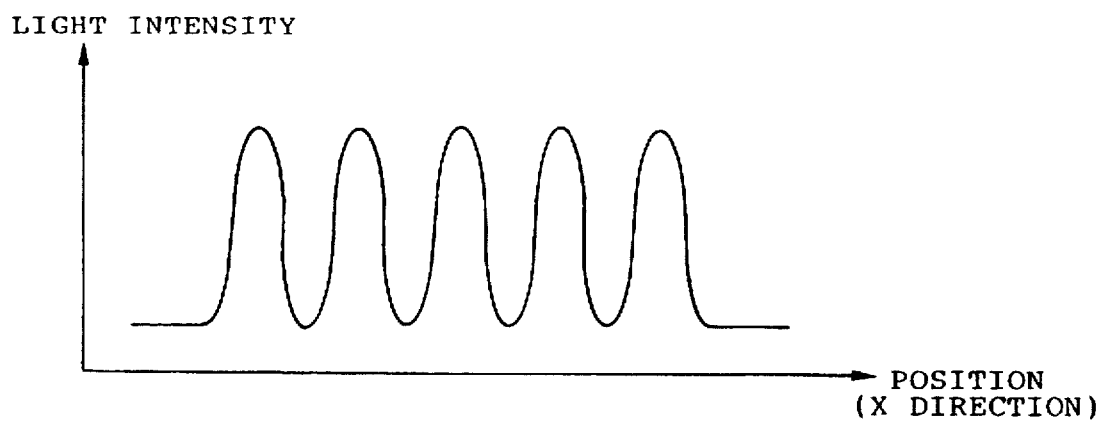
FIG. 10 is a plot showing the actual light-intensity distribution of the primary spatial image of the mask pattern in the direction in which the X-Y stage is scanned (in the direction designated by X in the drawing)

To begin with, the X-Y stage 4 is moved such that the knife-edge member 5 is positioned below the projection optical system 3 when the light-intensity distribution of the spatial image (i.e., a primary spatial image) of the mask pattern is detected (step ST1). The X-Y stage 4 is fixed at this time. In this condition, a spatial image of the mask pattern formed on the mask 23 is formed on the knife-edge member 5 via the projection optical system 3. FIG. 10 is a plot showing the actual light-intensity distribution of the spatial image (i.e., the primary spatial image) of the mask pattern formed on the light incidence surface 50 of the knife-edge member 5, in the direction in which the X-Y stage is scanned (i.e., in the X direction).

Figure 11:
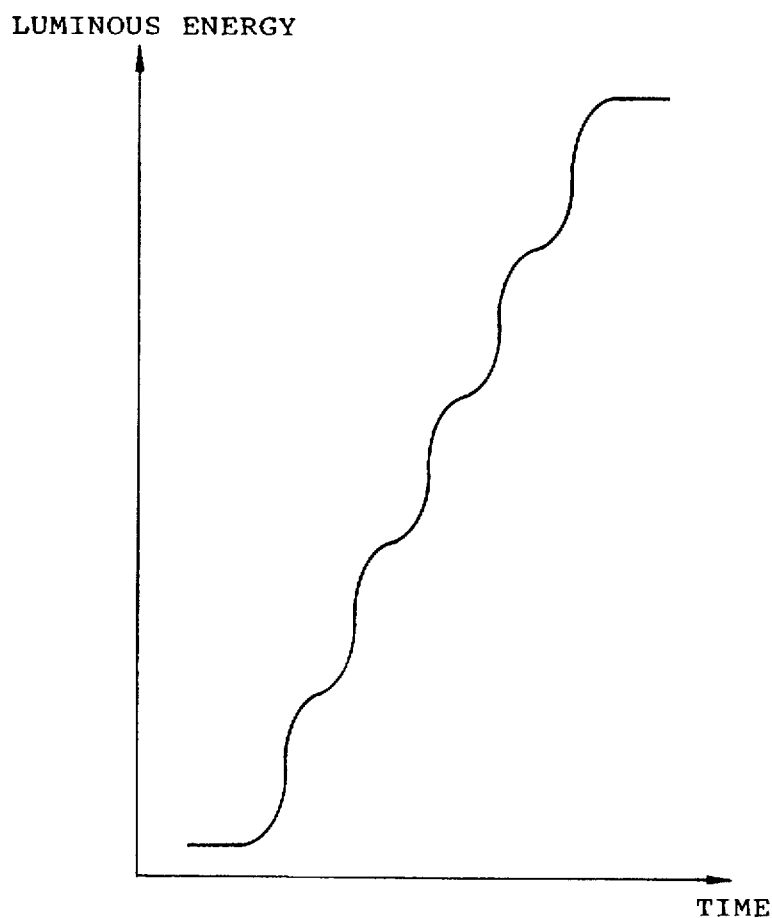
FIG. 11 is a plot showing the luminous energy distribution of the primary spatial image of the mask pattern formed on the basis of the output from a photosensor 41.

The spatial image of the mask pattern is scanned by the knife edge 58 of the knife-edge member 5 as a result of the movement of the X-Y stage 4 in the X direction (step ST4). The photosensor 41 receives the light of the spatial image of the mask pattern through the knife edge 58 (step ST2). After the scanning of the spatial image has been completed (step ST3), the main control system 400 calculates the luminous energy distribution of the spatial image on the basis of the output from the photosensor 41 (step ST5), as shown in FIG. 11. In FIG. 11, the horizontal axis represents time, and the vertical axis represents luminous energy. The main control system 400 can detect the light-intensity distribution of the spatial image with respect to the time (the vertical axis represents light intensity, and the horizontal axis represents time) by differentiating the luminous energy distribution shown in FIG. 11 with time (step ST6), as shown in FIG. 1.

Figure 12:
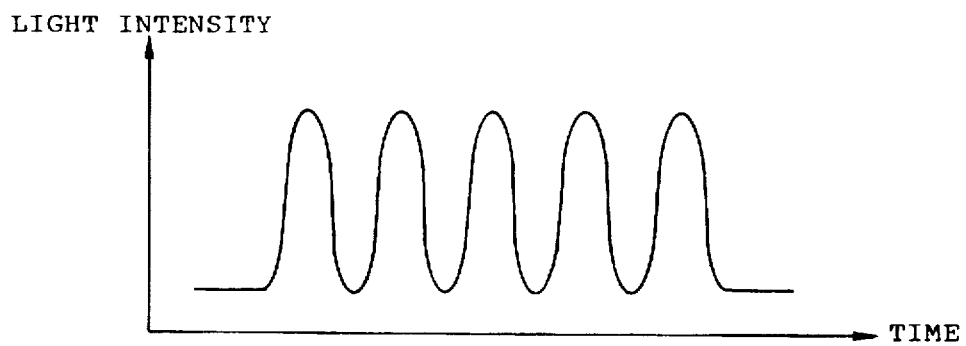
FIG. 12 is a plot showing the light-intensity distribution of the primary spatial image of the mask pattern with respect to time that is formed on the basis of the luminous energy distribution shown in FIG. 11.
Figure 13:
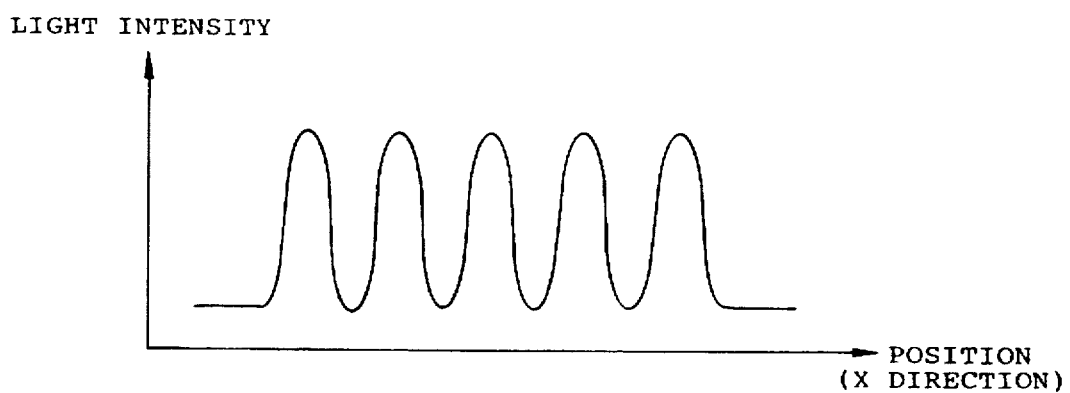
FIG. 13 is a plot showing the light-intensity distribution of the primary spatial image of the mask pattern, which is formed on the basis of the light-intensity distribution with respect to time shown in FIG. 12 and the positional information obtained by use of a laser interferometer for use with the wafer stage, in the direction in which the X-Y stage is scanned (in the X direction in the drawing)

The main control system 400 converts time information into positional information on the basis of the positional information received from a laser interferometer for use with the wafer stage as well as the light-intensity of the spatial image shown in FIG. 12 with respect to time. The light-intensity distribution with respect to the position of the spatial image (the vertical axis represents light intensity, and the horizontal axis represents the position in the direction of scanning) can be detected (step ST7), as shown in FIG. 13. As a result of the comparison between FIG. 10 and FIG. 13, it can be seen that the light-intensity distribution of the spatial image as finally detected by the main control system 400 substantially agrees with the actual light-intensity distribution of the spatial image of the mask pattern formed on the light incidence surface 50 of the knife-edge member 5 via the projection optical system 3.

In this way, according to the first embodiment, it is possible to detect the light-intensity distribution of the spatial image of the mask pattern formed through the projection optical system 3, as required, without the necessity of processes such as a patterning process, a development process, observation of a resist image using an electron microscope, or the like. The optical performance of the projection optical system can be controlled, as required, without carrying out actual exposure operations by means of a simulation technique based on the thus-detected light-intensity distribution of the spatial image. Many types of software for implementing such a simulation technique are available from, e.g., FINLE Technologies, Inc., or the like.

The information related to the absolute position of the spatial image of the mask pattern on the wafer 42 can be obtained by detecting the light-intensity distribution of the spatial image. The information related to the absolute position of the mask pattern on the mask 23 is already known. For this reason, a scale factor of the projection optical system 3, distortion of the projection optical system 3, and the position of the mask can be measured on the basis of the information related to the absolute position of the spatial image of the mask pattern on the wafer 42 and the information related to the absolute position of the mask pattern on the mask 23.

In the projection exposure apparatus of the present embodiment, conditions, such as the numerical apertures of the projection optical system 3 and the illumination optical system 1 or (e.g., normal illumination, zonal illumination, deformed illumination, or the like), which have significant effect on the imaging performance of the projection optical system 3 may be changed. In this case, the light-intensity distribution of the spatial images of various mask patterns formed through the projection optical system 3 can be detected. On the basis of the light-intensity distribution of the obtained spatial image, the resolution condition or various optical performances of a resist image of various types of mask patterns, formed through the projection optical system 3, can be known by using the previously described simulation technique.

The light-intensity distribution of each of the spatial images of various types of mask patterns is detected by moving the X-Y stage 4 along a direction perpendicular to the optical axis AX of the projection optical system 3. A resist image that would be actually formed in each defocused state is expected by means of the previously described simulation technique. Consequently, the focal depth (DOF) of the projection optical system 3 with respect to various types of mask pattern can be obtained.

As previously described, so long as the data on the light-intensity distribution of each of the spatial images of various types of mask pattern obtained when various conditions are changed is accumulated, the conditions can be optimized on the basis of the thus-accumulated data. Consequently, it is possible to obtain an exposure apparatus that has optimum the resolving power and focal depth optimum for each type of mask pattern.

The confirmation of coma-aberration of the projection optical system 3 will be described hereinbelow as an example of confirmation of the projection performance of the projection optical apparatus using the thus-obtained information related to the light-intensity distribution.

Figure 14:
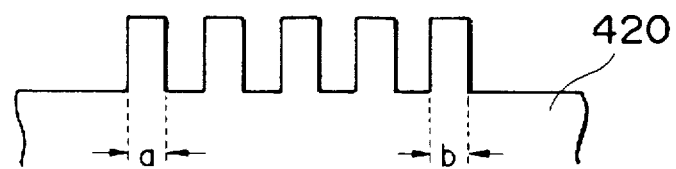
FIG. 14 is a cross-sectional view of a wafer (for use in checking coma-aberration) obtained when a predetermined mask pattern (a pattern without lines and space) is formed on the wafer by exposure.

In practice, an L&S pattern including five line-patterns formed on the mask 23 is patterned onto the wafer 42 that consists of a substrate coated with a positive resist, and the thus-patterned wafer is then developed. In this event, the wafer 42 has such a cross section as shown in FIG. 14. On the assumption that the bottom widths of the two lines on both ends of the wafer are measured by the electron microscope, and that the thus-measured values are "a" ($>0$) and "b" ($>0$), the following coma-aberration determination coefficient "c" can be set as follow:

$$c = |a-b|/(a+b).$$

A superior resist image can be obtained as this coefficient "c" approaches zero (that is, the imaging performance is improved). For this reason, this coefficient "c" serves as a common guide for determination of coma-aberration.

Another coefficient corresponding to the above-described coefficient can also be obtained from the light-intensity distribution of the spatial image.

Figure 15:
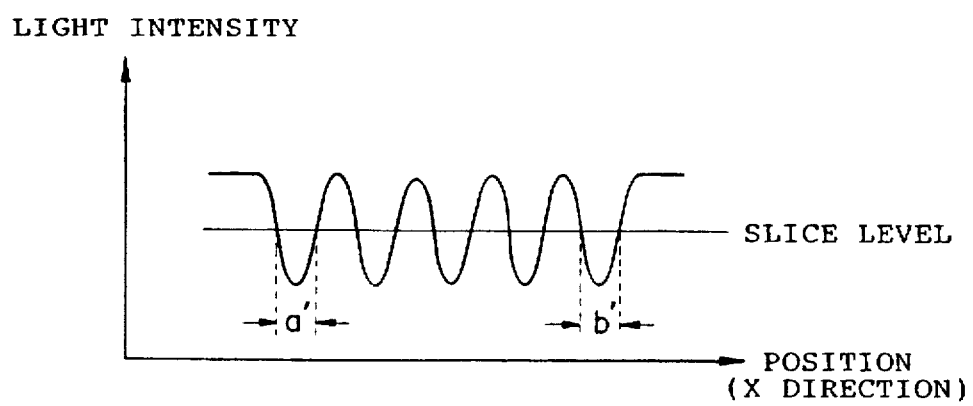
FIG. 15 is a plot showing the light-intensity distribution of the primary spatial image of the mask pattern used in fabricating the wafer, shown in FIG. 14, in the direction in which the primary spatial image is scanned (i.e., in the X direction)

To begin with, the light-intensity distribution of the spatial image of the mask pattern (i.e., the L&S pattern) is detected (see FIG. 15). A luminous intensity at which the line width at the center of the mask pattern would have a desired value (a converted value of the line width of the mask pattern, or the like) is calculated with respect to the thus-detected light-intensity distribution of the spatial image. When the widths a' and b' of the two lines on both ends of the pattern are obtained using the luminous intensity as slice levels, a coefficient c' (i.e., a theoretical value) can be obtained in the same manner as the coefficient c that is obtained with respect to the resist value.

By virtue of recent advances in the simulation technique, a resist image or the light-intensity distribution of a spatial image obtained by an optical system that includes residual aberrations can be easily simulated with considerably high accuracy. A plurality of samples of aberration occurred in the projection optical system 3 or arbitrarily given aberrations are prepared. Two types of simulation are performed on the basis of these aberrations, whereby the correlation between the coefficients c and c' can be examined.

According to the studies performed so far, a sufficiently practical accuracy is obtained even if the correlation between these coefficients is expressed in a simple linear function. In this case, however, it is basically necessary to modify the linear function in response to the difference in the resist conditions (e.g., the type of resist or the thickness of the resist) or illumination conditions.

It is easy to confirm the correlation between the thus-obtained coefficients "c" and c' by obtaining the coefficient "c" from the actually patterned resist image, and comparing the thus-obtained coefficient "c" with the coefficient c' obtained from the light-intensity distribution of the actually measured spatial image. In this way, the coma-aberration of the projection optical system 3 can be determined from the light-intensity distribution of the spatial image.

One example of confirmation of the best focal value in an arbitrary point within the exposure field of the projection optical system can be carried out in the following manner described below.

Figure 16:
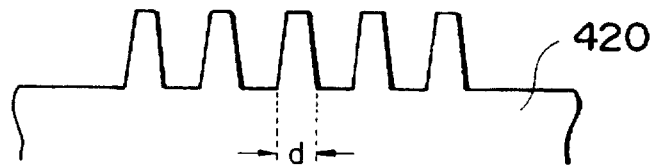
FIG. 16 is a cross-sectional view of a wafer (for use in checking coma-aberration) obtained when a predetermined mask pattern (a pattern without lines and space) is formed on the wafer by exposure.

In practice, the L&S pattern formed on the mask 23 is patterned onto the wafer 42 coated with a positive resist. The wafer 42 is shifted toward the focal point (i.e., in the Z direction) each time the pattern is patterned (based on the assumption that the position of the wafer 42 can be accurately determined). Further, the pattern is pattered on the wafer 42 while the wafer is shifted also within the plane perpendicular to the optical axis (i.e., within the X-Y plane) so as to prevent the images of the L&S pattern from overlapping. The thus-patterned images are developed. At this time, the resist image has a cross section as shown in FIG. 16 in a certain position in the direction of the focal point. The bottom width "d" of the line of the resist image at each focal point is measured by means of the electron microscope, and the thus-measured bottom width is subjected to polynomial approximation through data processing. Two focal points at which the bottom line width "d" becomes ±10% of the line width of the L&S pattern formed on the mask 23 are obtained, and the center of these two focal points is defined as a best focal position BF. The exposure must be set such that the bottom width of the line at the best focal position BF becomes approximately equal to the line width of the L&S pattern formed on the mask 23.

Another value corresponding to this best focal position BF can also be obtained from the light-intensity distribution of the spatial image.

Figure 17:
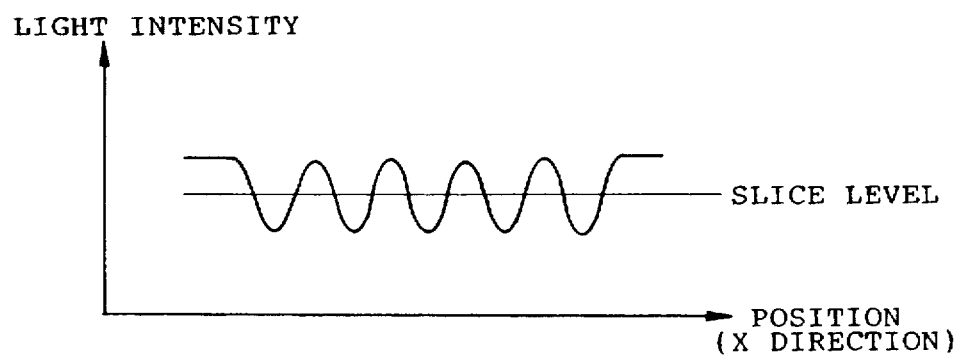
FIG. 17 is a plot showing the light-intensity distribution of the primary spatial image of a mask pattern (an L&S pattern) in a predetermined focused condition in the direction in which the primary spatial image is scanned (i.e., in the X direction)
Figure 18:
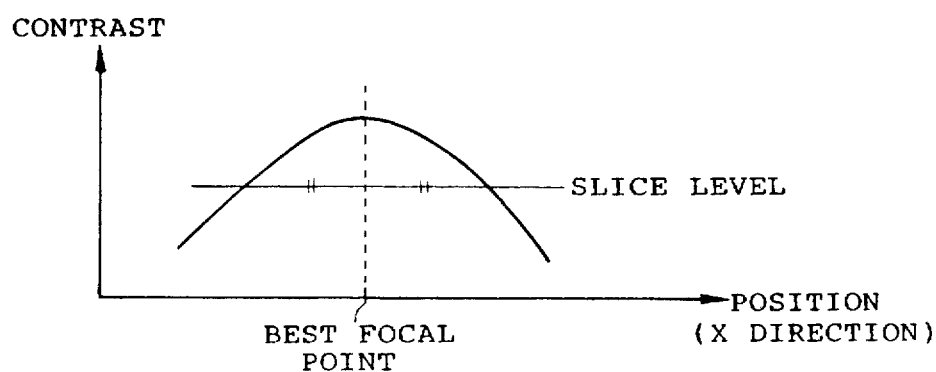
FIG. 18 is a plot showing the light-intensity distribution that is shown in FIG. 17 and is converted into contrast.

To begin with, the light-intensity distribution of the spatial image of the L&S pattern formed on the mask 23 is measured. The wafer 42 is shifted toward the focal point (i.e., in the Z direction) (based on the assumption that the position of the wafer 42 can be correctly determined). At this time, a such light-intensity distribution of the spatial image as shown in FIG. 17 is obtained in a certain position in the direction of the focal point. The contrast of the light-intensity distribution of the spatial image in each focal point is calculated, and the thus-calculated contrast is subjected to polynomial approximation (may also be subjected to spline interpolation) through data processing. With respect to the resultant distribution, focal values of two points (or one point) which would be variable arbitrary contrast values depending on the resist and illumination conditions are calculated. The intermediate point between the two points can be defined as the best focus BF (the theoretical value) (see FIG. 18).

Instead of calculating the focal values of the two points as calculated in the above description, the contrast value obtained in each focal point may be subjected to moving average processing at a certain arbitrary width (this width is optimized depending on the resist and illumination conditions). In this event, all that is required is to set the maximum value of the distribution obtained after the moving average processing to the best focal point BF. This method is equivalent to the convolution integration of the contrast and a function of one with an arbitrary focal width.

As described above, a resist image or the light-intensity distribution of a spatial image obtained by an optical system that includes residual aberrations can be easily simulated with considerably high accuracy. Therefore, a plurality of samples of aberration occurred in the projection optical system 3 or arbitrarily given aberrations are prepared. Two types of simulation are performed on the basis of these aberrations, whereby the correlation between best focal points BF and BF' can be examined.

According to the studies performed so far, so long as the method of obtaining the best focal positions of the light-intensity distribution of the spatial image is optimized in accordance with the resist and illumination conditions, a sufficiently practical accuracy is obtained together with only a constant offset arising in each condition.

The boundary line between the transmitting area 57 and the light-shielding area 56 can be constituted by straight lines extending along a plurality of arbitrary directions, and is not limited to the shape of a single straight line (knife-edge) as in the present embodiment, and further the scanning direction of the knife-edge member 5 is arbitrary.

Accordingly, it can easily be used to provide a positional relationship between the L & S pattern along an arbitrary direction and a knife edge extending along a direction perpendicular to the arbitrary direction as well as the positional relationship between the mask pattern such as L & S pattern along the X-direction and the knife-edge 58 extending along the Y-direction as shown in the present embodiment.

Therefore, at arbitrary points within an exposure field, through a knife edge (L-shaped one) having boundary lines which extend along two directions of X and Y, the respective light-intensity distributions of spatial images of two types of L & S mask patterns along the two directions of X and Y perpendicular to each other are measured, thus evaluating the best focal point. With this manner, focal differences (astigmatism) depending on a pattern direction in arbitrary points of the overall image surface, and an image surface, defined as a middle point thereof, can be measured.

It is easy to confirm the correlation between the thus-obtained best focal points BF and BF' by obtaining the best focal point BF from the actually patterned resist image, and by comparing the thus-obtained best focal point BF with the best focal point BF' when the actually measured light-intensity of the spatial image is obtained.

In this way, the flatness of an image surface as well as the best focal position of the projection optical system 3 can be determined from the light-intensity distribution of the spatial image.

Further, it is possible to grasp the numerical aperture of the projection optical system 3 and the resolution of the same obtained when the illumination conditions by measuring the coma-aberration and the image surface on the basis of the light-intensity distribution of the spatial image obtained in a plurality of arbitrary points within the exposure field.

It is also possible to determine the depth of focus (DOF) from the range of contrast values more than a certain level by obtaining a contrast distribution (that is obtained from the light-intensity distribution of the spatial image) before and after the best focal positions obtained in a plurality of arbitrary points within the exposure field.

The previously described example is one example of evaluation of the projection performance of the projection optical system 3. With regard to each of the above-described items, another method may be conceivable.

Next, a mechanism for correcting the projection performance of the projection optical system 3 will be described in detail with reference to FIG. 1. This correction mechanism corrects variations in the projection performance of the projection optical system 3 caused by changes in atmospheric pressure, the absorption of the illumination light, and the illumination conditions. Further, the correction mechanism has the function of distorting a projected image of the mask 23 corresponding to a distortion of the previously exposed area of the wafer 42.

The adjusting system 300 carries out the above-described correcting operation, and this adjusting system 300 is further controlled by the main control system 400.

Specifically, the projection performance of the projection optical system 3 is corrected by driving the mask stage 2a having the mask 23 thereon or a lens element 31 of the projection optical system 3 using the adjusting system 300, as shown in FIG. 1. In the projection optical system 3, the lens element 31 positioned nearest to the mask 23 is fixed to a support member 33. A lens element 32 following the lens element 31 and other elements subsequent to the lens element 32 are fixed to a lens barrel of the projection optical system 3. The optical axis AX of the projection optical system 3 shown in FIG. 1 represents the optical axis of the optical system (consisting of the lens element 32 and the other lens elements subsequent to the lens element 32) of the main body of the projection optical system 3. The support member 33 is connected to the lens barrel of the projection optical system 3 through drive elements which comprise at least two piezoelectric elements capable of expanding and contracting (only two drive elements 30a and 30b of all the drive elements are shown in FIG. 1).

Figure 19:
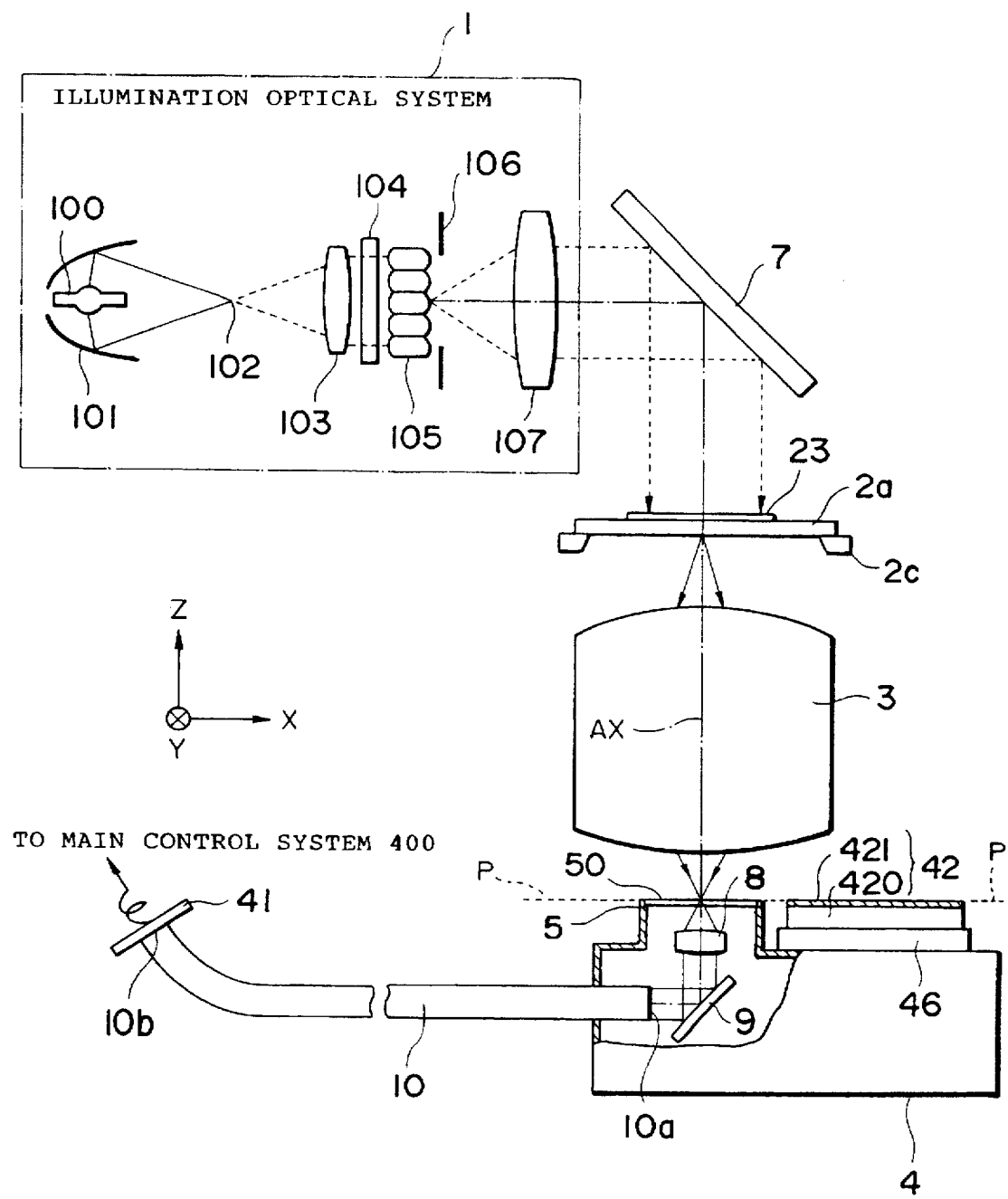
FIG. 19 is a schematic diagram showing the configuration of an applied example of the first embodiment of the projection exposure apparatus according to the present invention.

The lens element 31 is capable of being tilted with respect to the plane perpendicular to the optical axis AX as well as moving parallel to the optical axis AX as a result of the expansion and contraction of the drive elements 30a and 30b. Consequently, the projection performance of the projection optical system 3, e.g., the magnification of a projected image, distortion, a field curvature, or astigmatism, can be corrected. Likewise, the adjusting system 300 moves and tilts the mask 23 by expanding and contracting the drive elements 20a and 20b. Consequently, as with the variations in the projection performance, variations in the image formation characteristics are corrected. FIG. 19 shows an applied example of the embodiment shown in FIGS. 1 and 2. Although the light receiver 41 is within the X-Y stage 4 in the first embodiment shown in FIGS. 1 and 2, the light receiver 41 is disposed outside the X-Y stage 4 in the applied example shown in FIG. 19. The members shown in FIG. 19 that have the same functions as those shown in FIGS. 1 and 2 are assigned the same reference numerals as those used in FIGS. 1 and 2.

Specifically, a condenser lens 8 is disposed so as to converge and guide light passing through the knife-edge 58 formed on the knife-edge member 5 (i.e., the light incidence surface 50) to an entrance end surface 10a of an optical fiber 10 that serves as a light guide, as shown in FIG. 19. The light that travels through the optical fiber 10 is guided to the photosensor 41 disposed outside an exit end surface 10b of the optical fiber 10. A mirror 9 for use in deflecting the optical path is interposed in the optical axis between the condenser lens 8 and the entrance end surface 10a of the optical fiber 10.

With the above-described configuration, it is possible to prevent fluctuations of the optical path of the interferometer for use in measuring the position of the stage 4 as well as of the thermal expansion of the X-Y stage 14 due to the heat generated by the photosensor 41, as a result of the photosensor 41 being disposed outside the X-Y stage 4. Therefore, it becomes possible to maintain stable measurement accuracy of the X-Y stage 4 as a result of the provision of the photosensor 41 being the X-Y stage 4.

In the first embodiment shown in FIG. 1 and the applied example thereof (FIG. 19), the present invention is applied to the projection exposure apparatus that carries out an exposing operation while two-dimensionally moving the wafer in relation to the projection optical system. It goes without saying that the present invention can also be applied to a scan type projection exposure apparatus which carries out an exposing operation while relatively moving a wafer and a mask with respect to the projection optical system.

Figure 3:
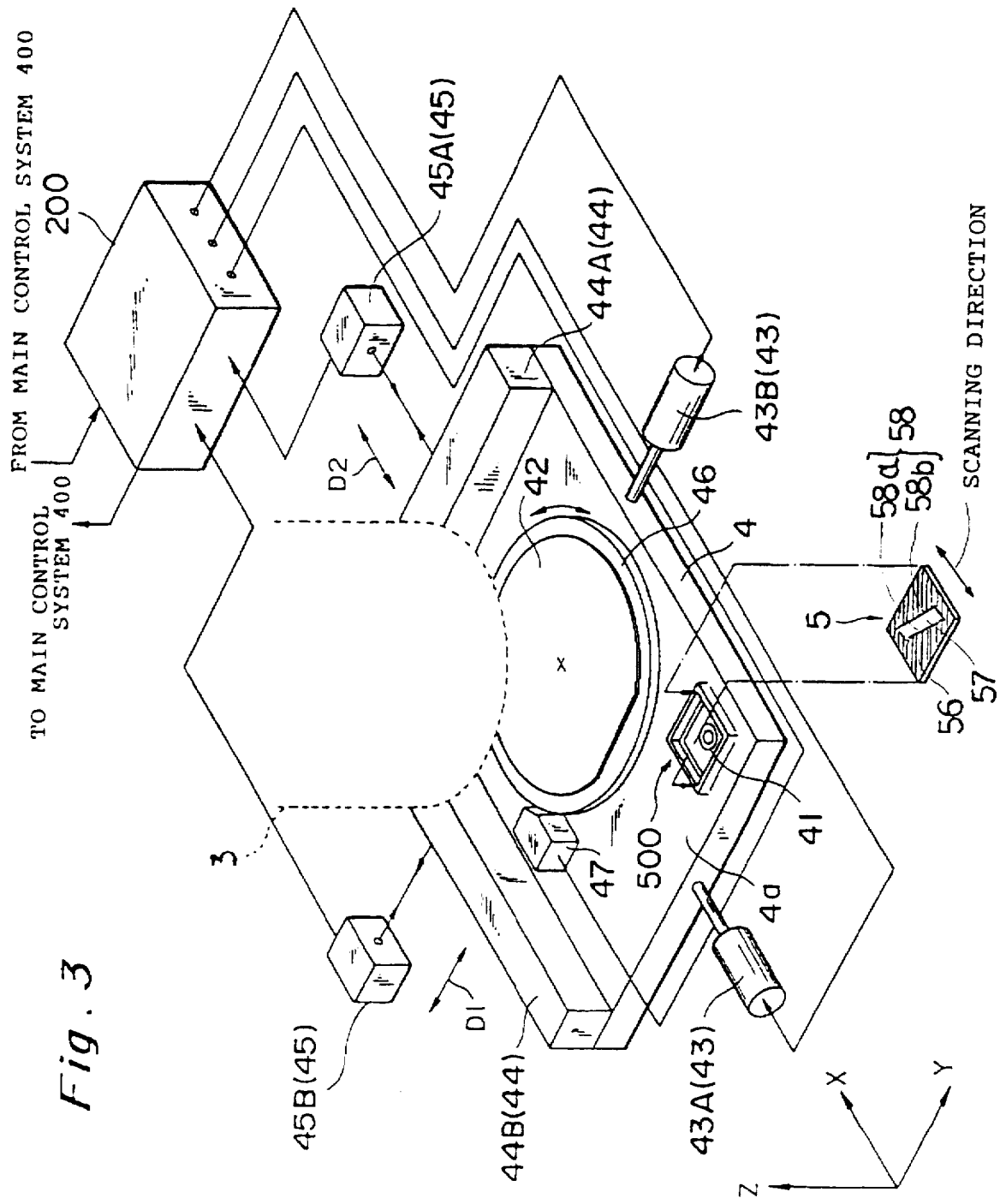
FIG. 3 is a perspective view showing the configuration of an X-Y stage in a projection optical system according to the present invention.

Similarly, since the interferometer 22 of FIG. 1 for positioning of the mask stage 2a also includes an X-interferometer for the X-direction and an Y-interferometer for the Y-direction as shown in FIG. 3, a light-intensity distribution of a space image can easily be measured with moving the mask side.

As described above, the light-intensity distribution of the spatial image of the mask pattern formed through the projection optical system 3 can be detected as required according to the present invention. Consequently, the optical performance of the projection optical system 3 can be controlled as required without actually carrying out an exposing operation.

In the previously described first embodiment of the projection exposure apparatus, for example, the knife-edge detection method is employed in order to detect the light-intensity distribution of the spatial image. According to the knife-edge detection method, while the spatial image of the mask pattern projected onto the knife-edge member 5 via the projection optical system 3 and the knife-edge 58 are moved relatively to each other, the photosensor 41 receives the light of the spatial image. The light-intensity distribution of the spatial image is detected on the basis of a relative position between the spatial image and the knife-edge 58 and the output from the photosensor 41 that receives light passing through the knife-edge member 5.

For the knife-edge detection method, if there are inconsistencies in the sensitivity (hereinafter simply referred to as sensitivity inconsistencies) of the light receiving surface of the photosensor 41 with regard to a light receiving position, these sensitivity inconsistencies adversely affect the accuracy of detection of the light-intensity distribution. The adverse effects on the accuracy of detection of the light-intensity distribution comprises two factors. One of them is an adverse effect of sensitivity inconsistencies resulting from distribution of diffracted light components from the mask pattern image (i.e., light in the direction of an angle) over the light receiving surface. A second factor is an adverse effect of sensitivity inconsistencies resulting from variations in the luminous energy distribution on the light receiving surface when the spatial image is scanned by the knife-edge 58.

Figure 20:
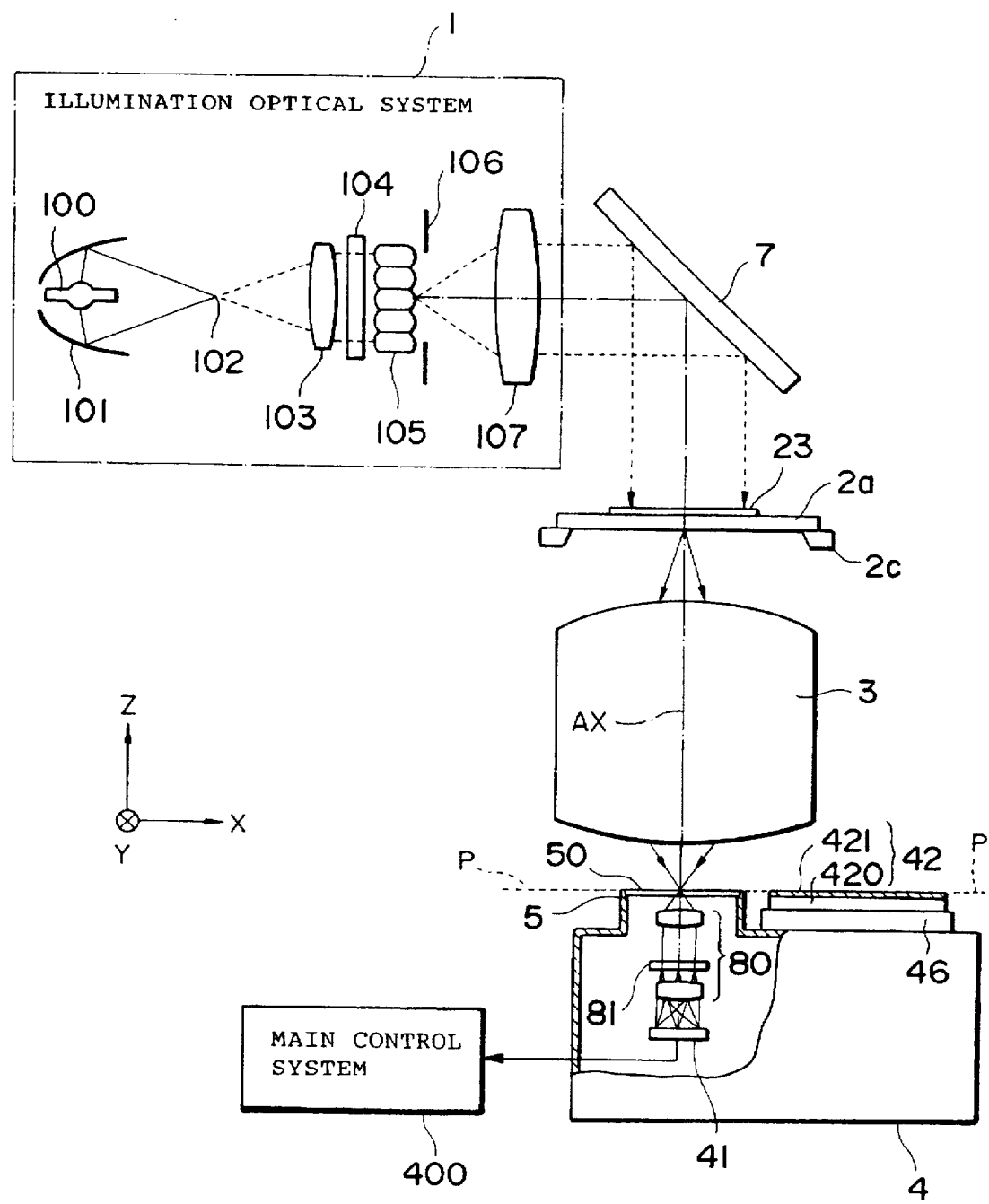
FIG. 20 is a schematic diagram showing the configuration of a second embodiment of a projection exposure apparatus according to the present invention.

To solve these problems, in a projection optical apparatus according to a second embodiment of the present invention, the light of the primary spatial image of the mask pattern formed on the light incidence surface 50 of the knife-edge member 5 through the projection optical system 3 is collected by way of the condenser optical system 80, and a secondary spatial image of the mask pattern is formed on the light receiving surface of such detection means as the photosensor 41, as shown in FIG. 20. For example, a diffusing plate is disposed in the optical path of the condenser optical system 80 such as an optically diffusing element 81 for optically diffusing light from the primary spatial image of the mask pattern. The diffracted light components from the primary spatial image substantially are converged on one point on the light-receiving surface of the photosensor 41 unless there is the diffusing plate 81 in the optical path.

However, the diffracted light components from the primary spatial image are not converged on one point as a result of the diffusing action of the diffusing plate 81 disposed in the condenser optical system 80. Instead, the diffracted light components enter the light receiving surface of the photosensor 41 while they are centered on one point and spread substantially to the same extent. In consequence, it is possible to reduce the adverse effect of sensitivity inconsistencies due to variations in the positions on the light receiving surface where the diffracted light components from the primary spatial image enter.

Further, the secondary spatial image and the knife-edge image formed on the light receiving surface are diffused over the light receiving surface to a large extent as a result of the diffusing action of the diffusing plate 81 disposed in the condenser optical system 80. Therefore, it is possible to reduce the adverse effect of sensitivity inconsistencies due to variations in the luminous energy distribution on the light receiving surface occurred when the primary spatial image is scanned by the knife-edge 58.

As described above, according to the second embodiment, it is possible to precisely detect the light-intensity distribution of the spatial image of the mask pattern formed through the projection optical system 3 without the necessity of processes such as a patterning process, a development process, observation of a resist image using an electron microscope, or the like, as required. In consequence, the optical performance of the projection optical system 3 can be precisely controlled on the basis of the thus-detected light-intensity distribution of the spatial image without carrying out actual exposure operations, as required.

More specifically, the projection exposure apparatus according to the second embodiment of the present invention will be described hereinbelow with reference to FIG. 20.

FIG. 20 is a schematic diagram showing the configuration of a second embodiment of a projection exposure apparatus according to the present invention.

In FIG. 20, the Z-axis is defined to be in parallel to the optical axis AX of the projection optical system 3; the X-axis is defined to be in parallel to the sheet of FIG. 20 within the plane perpendicular to the optical axis AX of the projection optical system 3; and the Y-axis is defined to be along a direction perpendicular to the sheet of FIG. 20 within the plane perpendicular to the optical axis AX of the projection optical system 3.

In the second embodiment, the same constituent elements as those of the first embodiment shown in FIGS. 1 and 2 are assigned the same reference numerals, and their explanations will be omitted here for purposes of brevity.

The configuration of the projection exposure apparatus of the second embodiment will be described principally based on the difference in structure between the first and second embodiments.

The condenser optical system 80 is disposed below the knife-edge member 5, as shown in the drawing. This condenser optical system 80 converges light from the primary spatial image of the mask pattern formed on the light incidence surface 50 of the knife-edge member 5 through the projection optical system 3 and forms the secondary spatial image of the mask pattern. The diffusing plate 81 (an optically diffusing element) for diffusing light from the primary spatial image is disposed in the optical path of the condenser optical system 80. The photosensor 41 having the light receiving surface positioned on the image surface in which the secondary spatial image is formed by the condenser optical system 80 is positioned below the condenser optical system 80, as shown in the drawing. The output from the photosensor 41 is fed to the main control system 400. It is not necessary for the condenser optical system 80 to have its aberration corrected in a superior manner. In other words, it is sufficient for the condenser optical system 80 to substantially converge the light of the primary spatial image on the light receiving surface of the photosensor 41.

The operation of the diffusing plate 81 shown in FIG. 20 will now be described with reference to FIGS. 21 to 25.

Figure 21:
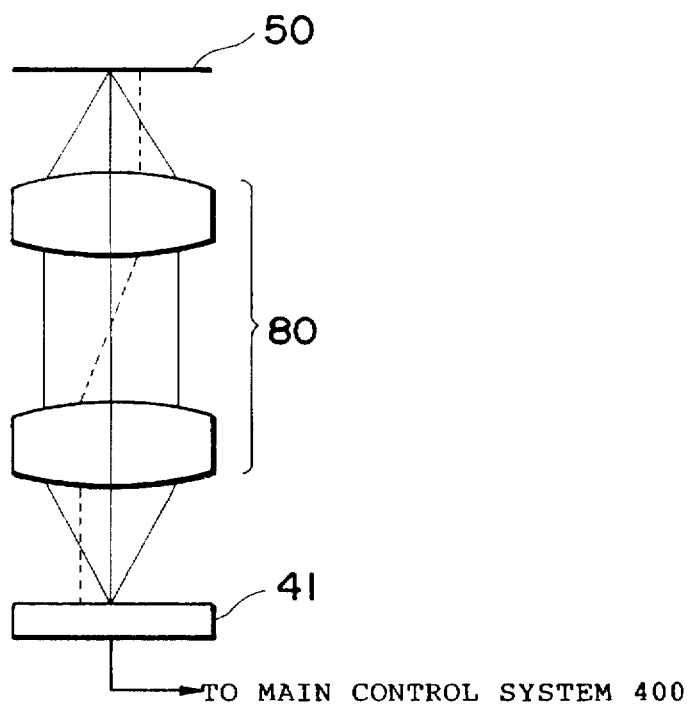
FIG. 21 is a schematic representation for explaining the operation of the optically diffusing element shown in FIG. 20 (variation 1)
Figure 22:
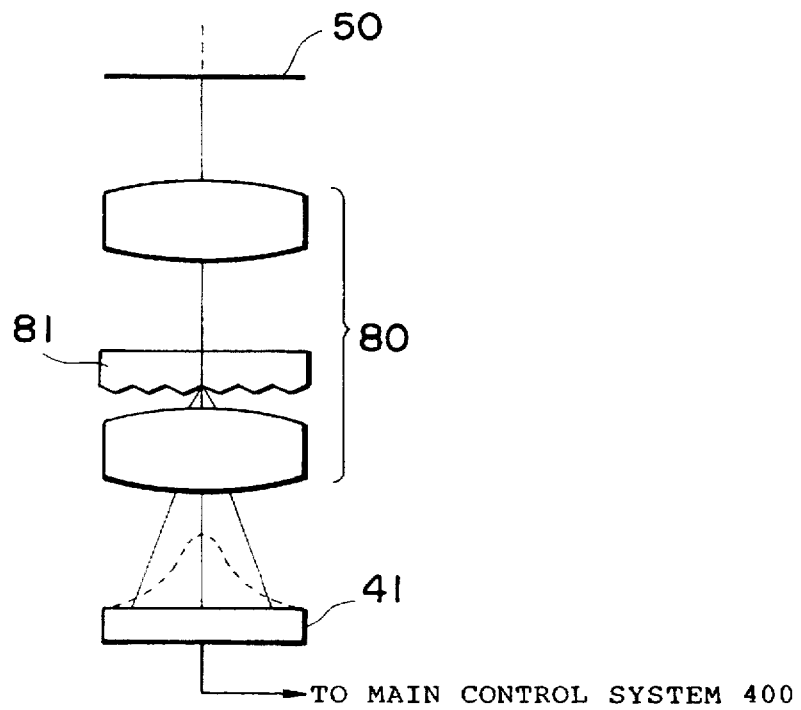
FIG. 22 is a schematic representation for explaining the operation of the optically diffusing element shown in FIG. 20 (variation 2)
Figure 23:
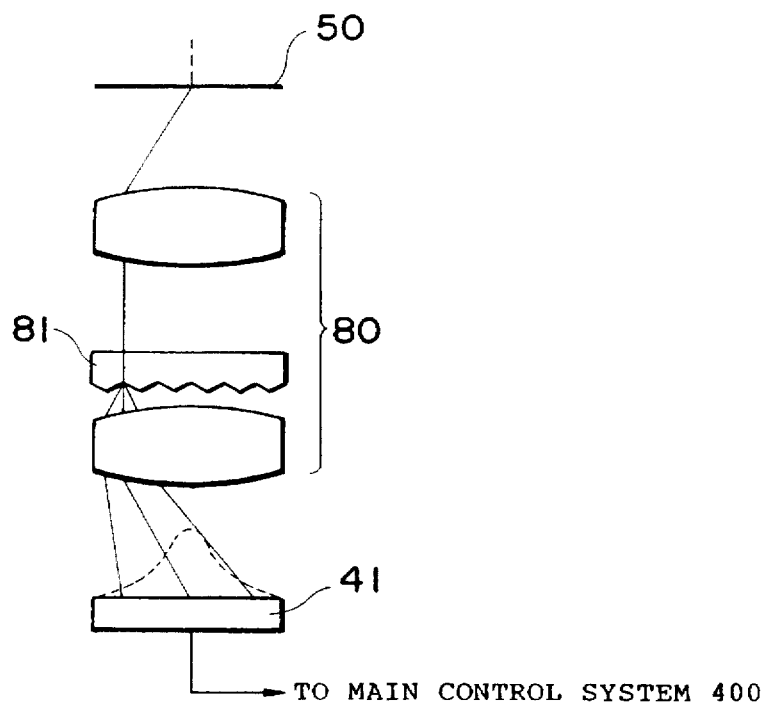
FIG. 23 is a schematic representation for explaining the operation of the optically diffusing element shown in FIG. 20 (variation 3)
Figure 24:
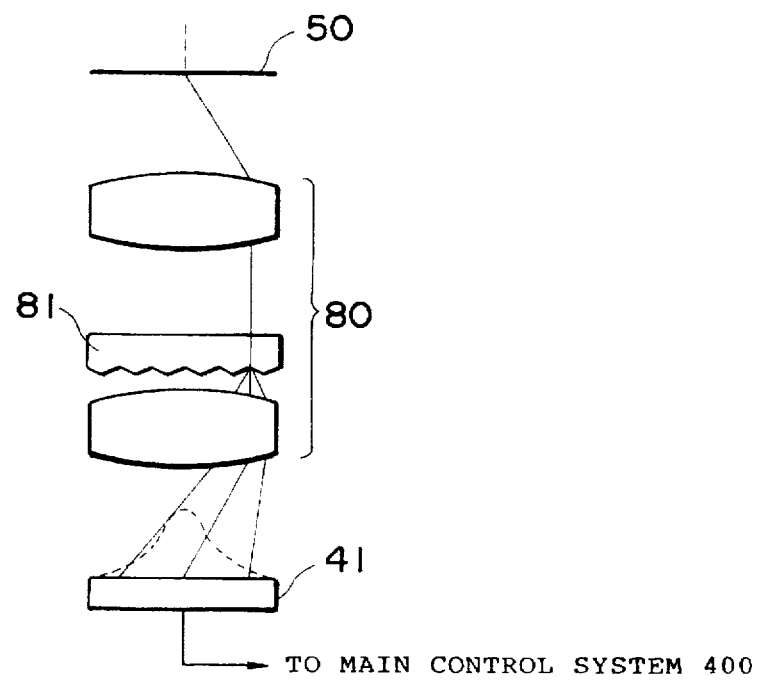
FIG. 24 is a schematic representation for explaining the operation of the optically diffusing element shown in FIG. 20 (variation 4)

When the diffusing plate 81 is not interposed in the optical path of the condenser optical system 80, as shown in FIG. 21, the diffracted light components from the primary spatial image of the mask pattern substantially converge on one point on the light receiving surface of the photosensor 41. In contrast, in the case of the second embodiment shown in FIG. 20, where the diffusing plate 81 is disposed in the optical path of the condenser optical system 80, as shown in FIGS. 22 to 24, the diffracted light components from the primary spatial image are not converged on one point as a result of the diffusing action of the diffusing plate 81. Instead, the diffracted light components enter the light receiving surface of the photosensor 41 while they are centered on one point and spread to substantially the same extent. In consequence, it is possible to reduce the adverse effect of sensitivity inconsistencies due to variations in the positions on the light receiving surface where the diffracted light components from the primary spatial image enter.

Figure 25:
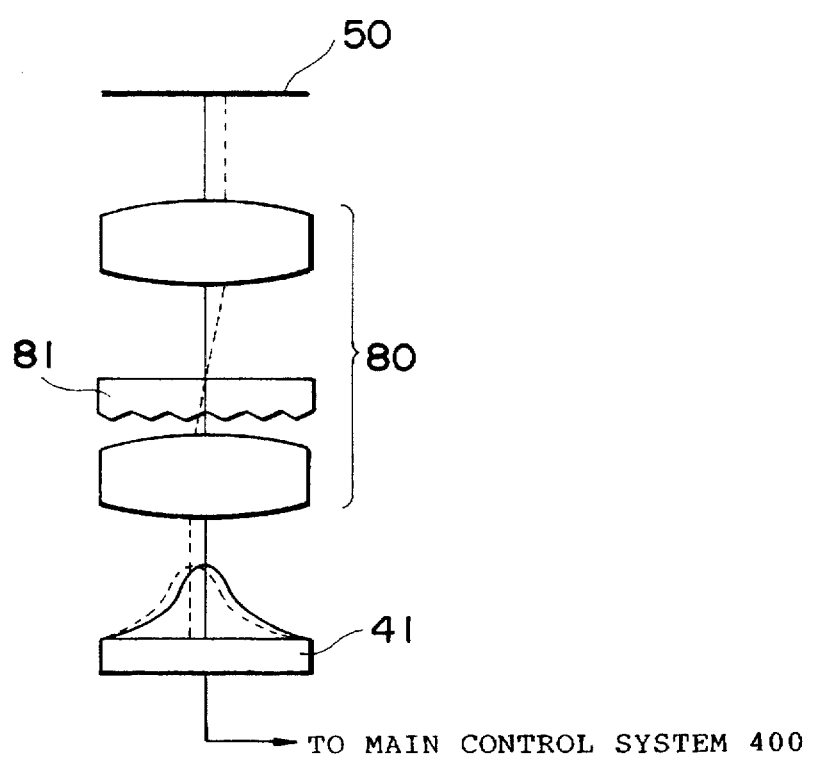
FIG. 25 is a schematic representation for explaining the operation of the optically diffusing element shown in FIG. 20 (variation 5)

Further, the secondary spatial image and the knife-edge image formed on the light receiving surface of the photosensor 41 are diffused over the light receiving surface to a large extent as a result of the diffusing action of the diffusing plate 81, as shown in FIG. 25. Therefore, it is possible to reduce the adverse effect of sensitivity inconsistencies due to variations in the luminous energy distribution on the light receiving surface which may occur when the primary spatial image is scanned by the knife edge.

In this way, according to the second embodiment (FIG. 20), it is possible to precisely detect the light-intensity distribution of the spatial image (i.e., the primary spatial image) of the mask pattern formed through the projection optical system 3, as required, without the necessity of processes such as a patterning process, a development process, observation of a resist image using an electron microscope, or the like, as well as without being substantially affected by the inconsistencies in the sensitivity of the light receiving surface. Consequently, the optical performance of the projection optical system 3 can be precisely controlled on the basis of the thus-detected light-intensity distribution of the spatial image without carrying out actual exposure operations, as required. Many types of tools are available from, e.g., FINLE Technologies, Inc., or the like, as the simulation technique that utilizes the light-intensity distribution.

The information related to the absolute position of the spatial image of the mask pattern on the wafer 42 can be obtained on the basis of the thus-obtained light-intensity distribution. The information related to the absolute position of the mask pattern on the mask 23 is already known. For this reason, a scale factor of the projection optical system 3, the distortion of the projection optical system 3, and the position of the mask 23 can be measured on the basis of the information related to the absolute position of the spatial image of the mask pattern on the wafer 42 and the information related to the absolute position of the mask pattern on the mask 23.

In the projection exposure apparatus of the present embodiment, conditions, such as the numerical apertures of the projection optical system 3 and the illumination optical system 1 or the like (e.g., normal illumination, zonal illumination, deformed illumination, or the like), which have significant effects on the imaging performance of the projection optical system 3, may be changed. In this case, the light-intensity distribution of the spatial images of various mask patterns formed through the projection optical system 3 is detected, as required. On the basis of the light-intensity distribution of the obtained spatial image, the resolution condition or various optical performances of a resist image of various types of mask patterns, formed through the projection optical system 3, can be known by using the previously described simulation technique.

The light-intensity distribution of each of the spatial images of various types of mask patterns is detected by moving the wafer stage (that includes at least the X-Y stage 4 and the Z stage 40) along a direction perpendicular to the optical axis AX of the projection optical system 3. A resist image that would be actually formed in each defocused state that is expected is simulated by means of the previously described simulation technique. Consequently, the focal depth (DOF) of the projection optical system 3 with respect to various types of mask pattern can be obtained.

As previously described, so long as the data on the light-intensity distribution of each of the spatial images of various types of mask pattern obtained when various conditions are changed is accumulated, the respective conditions can be optimized on the basis of the thus-accumulated data. Consequently, it is possible to obtain an exposure apparatus having the resolving power and focal depth optimum for each type of mask pattern.

Figure 26:
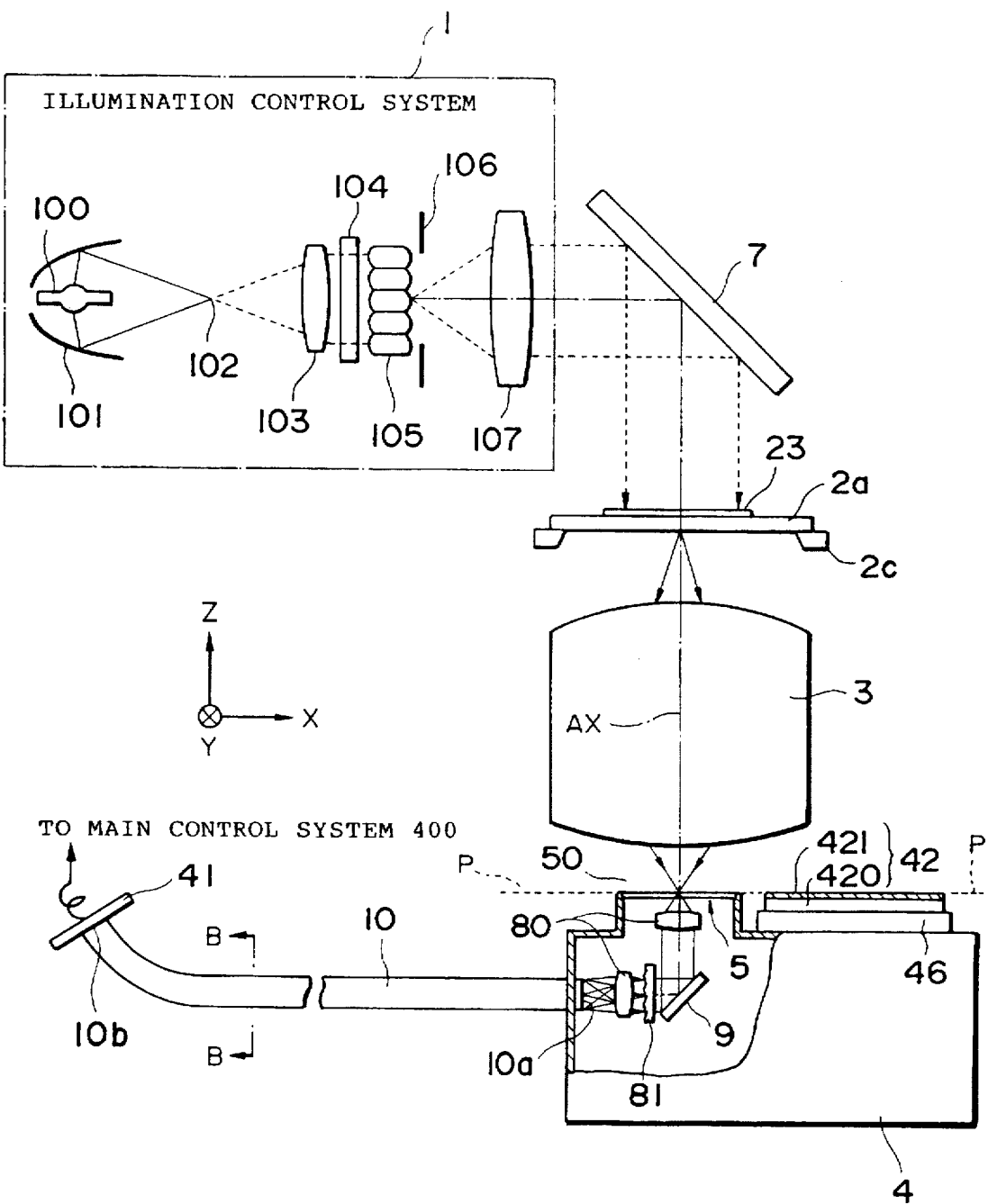
FIG. 26 is a schematic diagram showing the configuration of an applied example of the second embodiment of the projection exposure apparatus according to the present invention.

FIG. 26 is a schematic diagram showing the configuration of the applied example of the projection exposure apparatus according to the second embodiment of the present invention. This applied example is similar in configuration to the second embodiment shown in FIG. 20. The applied example is basically different from the second embodiment shown in FIG. 20 only in the following point: namely, the projection exposure apparatus of the applied example is provided with an optical fiber 10 (i.e., a light guide) having an entrance end 10a positioned in the surface where the secondary spatial image is formed by the condenser optical system 80 and an exit end 10b positioned in the light receiving surface of the photosensor 41. For this reason, the constituent elements shown in FIG. 26 that have the same functions as those of the second embodiment (FIG. 20) are assigned the same reference numerals as those used in FIGS. 1, 2, 19, and 20. The configuration of the projection exposure apparatus of the applied example will be described in consideration of the difference between the applied example and the second embodiment.

In the applied example, a secondary spatial image is formed on the entrance end 10a of the light guide 10 by way of the condenser optical system 80 and the diffusing plate 81. The entrance end 10a of the light guide 10 is positioned within the X-Y stage 4, and the exit end 10b is positioned outside the X-Y stage 4. The light receiving surface of the photosensor 41 is positioned in the exit end 10b of the light guide 10. Because of this configuration, in the applied example, the secondary spatial image formed by way of the condenser optical system 80 is guided to the outside of the X-Y stage 4 by the action of the light guide 10. The photosensor 41 can detect the thus-guided secondary spatial image.

Figure 27:
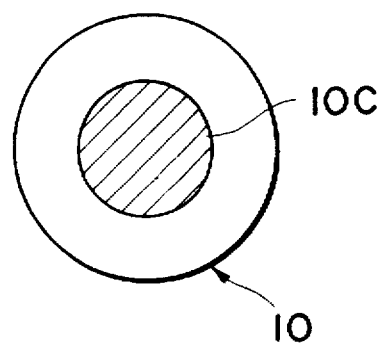
FIG. 27 is a cross-sectional view of a light guide 10 taken along line B—B shown in FIG. 26.
Figure 28:
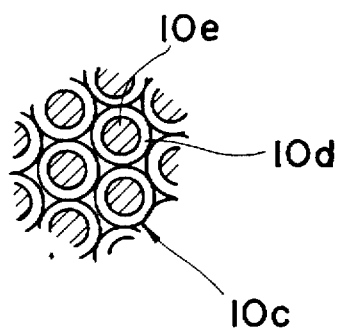
FIG. 28 is an enlarged view of the cross section of the light guide 10 shown in FIGS. 27 and 19.

FIGS. 27 and 28 are cross-sectional views showing the cross section of the light guide 10 shown in FIG. 26. FIG. 27 is the overall cross-sectional view of the light guide, and FIG. 28 is an enlarged cross-sectional view of a core 10c of the light guide 10.

This light guide 10 has the same cross section as the light guide 10 shown in FIG. 19.

As shown in FIGS. 27 and 28, when the core 10c of the light guide 10 is composed of a plurality of adjacent optical fibers 10d, only a core 10e of each optical fiber 10d allows the light to pass through. For this reason, the light guide 10 has sensitivity only in the dispersed cores 10e.

As described in the second embodiment (FIG. 20), the diffracted light components enter the entrance surface 10a of the light guide 10 while having substantially the same spread as a result of the action of the diffusing plate 81. The secondary spatial image and the knife-edge image formed on the entrance surface 10e are diffused by the entrance surface 10a to a large extent. Therefore, even with the applied example that employs the light guide 10 having sensitivity only in the dispersed cores 10e, it is possible to precisely detect the light-intensity distribution of the spatial image of the mask pattern without receipt of any substantial influence of inconsistencies in the sensitivity of the light receiving surface of the photosensor 41, as required.

The light guide 10 is capable of flexibly following high-speed movement of the X-Y stage 4. When the flexibility of the light guide 10 is improved to a much greater extent, the load exerted on the light guide 10 as a result of the actuation of the X-Y stage 4 will become negligible.

The applied example is particularly effective in the case where the photosensor 41 is too large to be housed in the X-Y stage 4 or where there is a risk of influence being exerted on the accuracy of the laser interferometer 45 for use with the X-Y stage 4 because of a large amount of heat generated by the light receiver 41.

In each of the previously described embodiments, the present invention is applied to the projection exposure apparatus which carries out exposure operations while two-dimensionally actuating the photosensitive substrate 42 with respect to the projection optical system 3. However, as previously described, it goes without saying that the present invention can be applied to a scan type projection exposure apparatus which carries out exposure operations while relatively moving a wafer and a mask with respect to the projection optical system.

As described above, according to the second embodiment (FIG. 20) and its applied example (FIG. 26), it is possible to detect the light-intensity distribution of the spatial image of the mask pattern formed through the projection optical system 3 with high accuracy without receipt of any substantial influence of inconsistencies of the sensitivity of the light receiving surface, as required. Therefore, the optical performance of the projection optical system 3 can be controlled with high accuracy without carrying out any actual projection and exposure operations.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to persons skilled in the art.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No. 67220/1996 filed on Feb. 28, 1996, No. 67224/1996 filed on Feb. 28, 1996, No. 32245/1995 filed on Feb. 21, 1995 and No. 32247/1995 filed on Feb. 21, 1995 are hereby incorporated by reference.

What is claimed is:

1. A projection exposure apparatus comprising:
   an illumination optical system for illuminating a mask on which a predetermined mask pattern is formed with exposure light having a predetermined wavelength;
   a stage allowing a photosensitive substrate to be held on a main surface thereof;
   a projection optical system for projecting an image of said mask pattern onto said photosensitive substrate;
   a knife-edge member having a transmission area for transmitting the exposure light passing through said projection optical system, a light-shielding area for preventing transmission of the exposure light, and a knife-edge defined as a boundary line between said transmission area and said light shielding area, said knife-edge member being disposed such that a light incidence surface of said knife-edge member is leveled with the reference plane substantially including an exposure surface of said photosensitive substrate when said photosensitive substrate is placed on the main surface of said stage;

a light receiving device for receiving light of a spatial image of said mask pattern formed on the light incidence surface of said knife-edge member through said projection optical system;

a drive mechanism for changing a relative position between the spatial image of said mask pattern formed through said projection optical system and the knife-edge of said knife-edge member while leveling the light incidence surface of said knife-edge member with the reference plane; and a detection mechanism for detecting a light-intensity distribution of the spatial image of said mask pattern on the basis of a relative position between the spatial image of said mask pattern and the knife-edge of said knife-edge member and an output from said light receiving device that receives light passing through said knife-edge member.

2. The projection exposure apparatus according to claim 1, further comprising a supporting surface provided on the main surface of said stage, said supporting surface supporting said knife-edge member such that the light incidence surface of said knife-edge member is substantially leveled with the reference plane.

3. The projection exposure apparatus according to claim 1, further comprising a space provided in said stage, for housing at least the light receiver, said knife-edge member being disposed at an opening portion of said space.

4. The projection exposure apparatus according to claim 1, further comprising a space provided in said stage, for housing at least a condenser optical system for converging light from the spatial image formed on the light incidence surface of said knife-edge member through said projection optical system, said knife-edge member being arranged at an opening portion of said space.

5. The projection exposure apparatus according to claim 4, further comprising a light guide member for guiding light passing through said condenser optical system outside said stage, whereby light emitted from a light emitting surface of said light guide member is guided to said light receiving device.

6. A projection exposure apparatus, comprising:

an illumination optical system for illuminating a mask on which a predetermined mask pattern is formed with exposure light having a predetermined wavelength;

a stage allowing a photosensitive substrate to be held on a main surface therefore;

a projection optical system for projecting an image of said mask pattern onto said photosensitive substrate;

a knife-edge member having a transmission area for transmitting the exposure light passing through said projection optical system, a light-shielding area for preventing transmission of the exposure light, and a knife-edge defined as a boundary line between said transmission area and said light shielding area, said knife-edge member being disposed such that a light incidence surface of said knife-edge member is leveled with the reference plane substantially including an exposure surface of said photosensitive substrate when said photosensitive substrate is placed on the main surface of said stage;

a condenser optical system for converging light from a primary spatial image of said mask pattern formed on the light incidence surface of said knife-edge member through said projection optical system and forming a secondary spatial image of said mask pattern;

an optical diffuser being disposed in the optical path of said condenser optical system and diffusing light from the primary spatial image of said mask pattern;

a light receiving device for receiving light from the secondary spatial image of said mask pattern formed by said condenser optical system;

a drive mechanism for changing a relative position between the primary spatial image of said mask pattern formed through said projection optical system and the knife-edge of said knife-edge member while leveling the light incidence surface of said knife-edge member with the reference plane; and a detection mechanism for detecting a light-intensity distribution of the primary spatial image of said mask pattern on the basis of a relative position between the primary spatial image of said mask pattern and the knife-edge of said knife-edge member and an output from said light receiving device that receives light passing through said knife-edge member.

7. The projection exposure apparatus according to claim 6, further a supporting surface provided on the main surface of said stage, said supporting surface supporting said knife-edge member such that the light incidence surface of said knife-edge member is substantially leveled with the reference plane.

8. The projection exposure apparatus according to claim 6, further comprising a space provided in said stage, for housing at least said condenser optical system, said optical diffuser, and said light receiving device, said knife-edge member being arranged at an opening portion of said space.

9. The projection exposure apparatus according to claim 6, further comprising a space provided in said stage, for housing at least said condenser optical system and said optical diffuser, said knife-edge member being arranged at an opening portion of said space.

10. The projection exposure apparatus according to claim 9, further comprising a light guide member for guiding light passing through said condenser optical system outside said stage, whereby light emitted from a light emitting surface of said light guide member is guided to said light receiving device.

11. A method of detecting a light-intensity distribution of a spatial image of a predetermined mask pattern formed through a projection optical system, the method for use with a projection exposure apparatus including an illumination optical system for illuminating a mask on which said predetermined mask pattern is formed with exposure light having a predetermined wavelength, a projection optical system for projecting said mask pattern onto a photosensitive substrate, and a stage allowing said photosensitive substrate to be held on a main surface thereof, the method comprising the steps of:

positioning said mask having said predetermined mask pattern formed thereof in a predetermined location;

disposing a knife-edge member having a transmission area for transmitting the exposure light passing through said projection optical system, a light-shielding area for preventing transmission of the exposure light, and a knife-edge defined as a boundary line between said transmission area and said light shielding area, in such a way that a light incidence surface of said knife-edge member is leveled with the reference plane substantially including an exposure surface of said photosensitive substrate when said photosensitive substrate is placed on the main surface of said stage;

sequentially receiving light from the spatial image of said mask pattern using a light receiving device by changing a relative position between the spatial image of said mask pattern formed on the light incidence surface of said knife-edge member through said projection optical system and the knife-edge of said knife-edge member while leveling the light incidence surface of said knife-edge member with the reference plane; and detecting a light-intensity distribution of the spatial image of said mask pattern on the basis of a relative position between the spatial image of said mask pattern and the knife-edge of said knife-edge member and an output from said light receiving device that receives light passing through said knife-edge member.

12. A method according to claim 11, further comprising the step of:

guiding light from the spatial image of said mask pattern formed on the light incidence surface of said knife-edge member to said light receiving device by a condenser optical system disposed between said knife-edge member and said light receiving device.

13. A method according to claim 12, further comprising the step of:

diffusing light from the spatial image of said mask pattern formed on the light incidence surface of said knife-edge member by a optical diffuser disposed in the optical axis of said condenser optical system.

14. The projection exposure apparatus according to claim 1, further comprising an adjusting apparatus for adjusting optical characteristics of said projection optical system on the basis of the output from said detection mechanism.

15. The projection exposure apparatus according to claim 14, further comprising a space provided in said stage, said space provided for housing at least the light receiver, and said knife-edge member being disposed at an opening portion of said space.

16. The projection exposure apparatus according to claim 14, further comprising a space provided in said stage, said space provided for housing at least a condenser optical system for converging light from the spatial image formed on the light incidence surface of said knife-edge member through said projection optical system, said knife-edge member being arranged at an opening portion of said space.

17. The projection exposure apparatus according to claim 16, further comprising a light guide member for guiding light passing through said condenser optical system outside said stage, whereby light emitted from a light emitting surface of said light guide member is guided to said light receiving device.

18. A method for fabricating semiconductor or liquid crystal display devices by using the projection exposure apparatus according to claim 14, comprising the steps of:

illuminating said mask with light having a predetermined wavelength; and projecting an image of a pattern on said mask onto said photosensitive substrate through said projection optical system, thereby performing an exposure process.

19. A method for fabricating semiconductor or liquid crystal display devices by using the projection exposure apparatus according to claim 15, comprising the steps of:

illuminating said mask with light having a predetermined wavelength; and projecting an image of a pattern on said mask onto said photosensitive substrate through said projection optical system, thereby performing an exposure process.

20. A method for fabricating semiconductor or liquid crystal display devices by using the projection exposure apparatus according to claim 16, comprising the steps of:

illuminating said mask with light having a predetermined wavelength; and projecting an image of a pattern on said mask onto said photosensitive substrate through said projection optical system, thereby performing an exposure process.

21. The projection exposure apparatus according to claim 6, further comprising an adjustment apparatus for adjusting optical characteristics of said projection optical system on the basis of an output of said detection mechanism.

22. The projection exposure apparatus according to claim 21, further comprising a space provided in said stage, said space provided for housing at least said condenser optical system and said optical diffuser, and said knife-edge member being arranged at an opening portion of said space.

23. The projection exposure apparatus according to claim 21, further comprising a light guide member for guiding light passing through said condenser optical system outside said stage, whereby light emitted from a light emitting surface of said light guide member is guided to said light receiving device.

24. A method for fabricating semiconductor or liquid crystal display devices by using the projection exposure apparatus according to claim 21, comprising the steps of:

illuminating said mask with light having a predetermined wavelength; and projecting an image of a pattern on said mask onto said photosensitive substrate through said projection optical system, thereby performing an exposure process.

25. A method for fabricating semiconductor or liquid crystal display devices by using the projection exposure apparatus according to claim 22, comprising the steps of:

illuminating said mask with light having a predetermined wavelength; and projecting an image of a pattern on said mask onto said photosensitive substrate through said projection optical system, thereby performing an exposure process.

26. A method for fabricating semiconductor or liquid crystal display devices by using the projection exposure apparatus according to claim 16, comprising the steps of:

illuminating said mask with light having a predetermined wavelength; and projecting an image of a pattern on said mask onto said photosensitive substrate through said projection optical system, thereby performing an exposure process.

* * * * *